US012310112B2

(12) United States Patent
Ma et al.

(10) Patent No.: US 12,310,112 B2
(45) Date of Patent: May 20, 2025

(54) DISPLAY SUBSTRATE AND DISPLAY DEVICE

(71) Applicants: Hefei Xinsheng Optoelectronics Technology Co., Ltd., Anhui (CN); BOE TECHNOLOGY GROUP CO., LTD., Beijing (CN)

(72) Inventors: Xiaoye Ma, Beijing (CN); Ran Zhang, Beijing (CN); Yongxian Xie, Beijing (CN); Mingfei Zhang, Beijing (CN); Xiaofeng Yin, Beijing (CN); Tong Yang, Beijing (CN); Fengzhen Lv, Beijing (CN); Yongcan Wang, Beijing (CN); Xiaofang Gu, Beijing (CN)

(73) Assignees: Hefei Xinsheng Optoelectronics Technology Co., Ltd., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/016,422

(22) PCT Filed: Jan. 28, 2022

(86) PCT No.: PCT/CN2022/074531
§ 371 (c)(1),
(2) Date: Jan. 16, 2023

(87) PCT Pub. No.: WO2023/141923
PCT Pub. Date: Aug. 3, 2023

(65) Prior Publication Data
US 2024/0395829 A1 Nov. 28, 2024

(51) Int. Cl.
*H10D 86/60* (2025.01)
*G02F 1/1362* (2006.01)
(Continued)

(52) U.S. Cl.
CPC ....... *H10D 86/60* (2025.01); *G02F 1/136286* (2013.01); *G02F 1/1368* (2013.01); *H10D 86/443* (2025.01)

(58) Field of Classification Search
CPC ............. G02F 1/1347; G02F 1/136286; G02F 1/1368; G02F 1/13338; H10D 86/60; H10D 86/443
See application file for complete search history.

(56) References Cited

U.S. PATENT DOCUMENTS

| 2016/0378254 A1* | 12/2016 | Wang | G06F 3/0443 |
| | | | 345/174 |
| 2017/0131816 A1* | 5/2017 | Zou | G06F 3/0448 |
| 2017/0255321 A1* | 9/2017 | Ding | G06F 3/04164 |

FOREIGN PATENT DOCUMENTS

| CN | 101685226 | * | 7/2011 | ........... G02F 1/1343 |
| CN | 104536637 A | | 4/2015 | |

(Continued)

*Primary Examiner* — Charles S Chang
(74) *Attorney, Agent, or Firm* — HOUTTEMAN LAW LLC

(57) ABSTRACT

The embodiment of the present disclosure provides a display substrate including a plurality of gate lines and a plurality of data lines. The plurality of gate lines each extend along a first direction, and the plurality of data lines each extend along a second direction. The plurality of data lines are spatially crossed with the plurality of gate lines to define a plurality of pixel regions, and at least one sub-pixel is provided in each of the plurality of pixel regions. At least three sub-pixels adjacent to each other along the second direction form one of a plurality of pixels. All the sub-pixels within one of the plurality of pixels are coupled to a same data line of the plurality of data lines.

15 Claims, 19 Drawing Sheets

(51) Int. Cl.
*G02F 1/1368* (2006.01)
*H10D 86/40* (2025.01)

(56) References Cited

FOREIGN PATENT DOCUMENTS

| | | | | |
|---|---|---|---|---|
| CN | 105739804 A | 7/2016 | | |
| CN | 106876330 | * | 6/2017 | ............. H01L 21/77 |

* cited by examiner

C-C' (D-D')

C-C'

DISPLAY SUBSTRATE AND DISPLAY DEVICE

TECHNICAL FIELD

The embodiments of the present disclosure relate to the technical field of display, and in particular to a display substrate and a display device.

BACKGROUND

Touch and Display Driver Integration (TDDI) products have been widely used due to their advantages such as simple manufacture process and low cost.

SUMMARY

An embodiment of the present disclosure provides a display substrate and a display device.

As a first aspect, an embodiment of the present disclosure provides a display substrate including a plurality of gate lines and a plurality of data lines. The plurality of gate lines extend along a first direction respectively, and the plurality of data lines extend along a second direction respectively. The plurality of data lines are spatially crossed with the plurality of gate lines to define a plurality of pixel regions, and at least one sub-pixel is formed in each of the plurality of pixel regions. At least three sub-pixels adjacent to each other along the second direction form one of a plurality of pixels. All the sub-pixels within one of the plurality of pixels are coupled to a same data line of the plurality of data lines.

In some embodiments, one sub-pixel is disposed in each of the plurality of pixel regions. All the sub-pixels of each of the pixels are arranged along the second direction in sequence, and all the sub-pixels of each of the pixels are coupled to different gate lines of the plurality of gate lines, respectively.

In some embodiments, the display substrate further includes a base substrate, and each of the pixels includes a first electrode and a second electrode on the base substrate. The first electrode and the second electrode are disposed away from the base substrate in sequence. The first electrode includes a plurality of first sub-electrodes, and the second electrode includes a plurality of second sub-electrodes. An orthographic projections of the first sub-electrode on the base substrate at least partially overlaps an orthographic projections of the second sub-electrode on the base substrate. The second sub-electrodes adjacent to each other along the first direction and/or the second direction are coupled to each other to form a second block electrode, and the second block electrode serves as a touch electrode.

In some embodiments, the formed second block electrode includes a plurality of second block electrodes arranged in an array. Each of the plurality of second sub-electrodes includes the same number of second sub-electrodes arranged in an array. Each second sub-electrode is formed thereon with a plurality of slits arranged along the second direction, spaced apart from each other, and extending along the first direction, respectively. Among two adjacent rows of the second sub-electrodes in two second block electrodes adjacent to each other along the second direction, one row of the second sub-electrodes is disconnected from the other row of the second sub-electrodes.

In some embodiments, the display substrate further includes a plurality of transistors, wherein each of the sub-pixels includes one of the plurality of transistors. The transistor is located at a position where the data line crosses the gate line. An orthographic projection of the transistor on the base substrate is between an orthographic projection, on the base substrate, of an opening region of the sub-pixel where the transistor is located and an orthographic projection, on the base substrate, of the data line coupled to the sub-pixel. A gate electrode of the transistor is proximal to the gate line coupled to the transistor, a source electrode of the transistor is proximal to the data line coupled to the transistor, and a drain electrode of the transistor is proximal to a gate electrode of another transistor adjacent to the transistor along the second direction. The drain electrode is coupled to the first sub-electrode. The two second sub-electrodes adjacent to each other along the first direction in the second block electrode are coupled to each other via a first connection portion. The first connection portion extends along the first direction, and an orthographic projection of the first connection portion on the base substrate and an orthographic projection of the data line on the base substrate intersect each other.

In some embodiments, the first connection portion is in the same layer as the second sub-electrode.

In some embodiments, the display substrate further includes a second connection portion configured to couple the two second sub-electrodes adjacent to each other along the second direction in the second block electrode.

In some embodiments, the display substrate further includes a plurality of touch signal line sets, each of the plurality of touch signal line sets includes a plurality of touch signal lines. Each of the plurality of touch signal lines extends along the second direction. Each of the plurality of touch signal line sets corresponds to one column of second block electrodes. Each of the second block electrodes is coupled to at least one of the plurality of touch signal lines.

In some embodiments, the sub-pixels are arranged in an array, and one data line and one touch signal line are disposed between any two adjacent columns of sub-pixels.

In some embodiments, the sub-pixels are arranged in an array. One data line is disposed between any two adjacent columns of the sub-pixels. Each of the sub-pixels has two domain regions arranged along the first direction, and domain boundaries between the domain regions of a column of sub-pixels are on a same straight line. An orthographic projection of each of the touch signal lines on the base substrate overlaps orthographic projections of the domain boundaries of the column of sub-pixels on the base substrate In some embodiments, the touch signal line is located at the same layer as the data line and the source electrode and drain electrode of the transistor. The second block electrode is on a side of the touch signal line away from the base substrate, and a first insulation layer is between the second block electrode and the touch signal line. The second block electrode is coupled to the touch signal line via a first through hole formed in the first insulation layer. An orthographic projection of the first through hole on the base substrate is on a side, away from the transistor, of the opening region of the sub-pixel where the first through hole is located.

In some embodiments, one of the touch signal lines is coupled to a corresponding one of the second block electrodes through a plurality of the first through holes arranged along the second direction. Multiple gate lines are disposed between any two adjacent first through holes of the plurality of the first through holes. In a row of the pixel regions, in which the first through hole is formed, with the pixel regions arranged along the first direction, the first through hole and the drain electrode of the transistor are respectively located on different straight lines extending along the first direction, and a minimum distance between the first through hole and one of the gate lines closest to the first through hole is less than a minimum distance between a position where the drain electrode of the transistor is coupled to the first sub-electrode and the gate line.

In some embodiments, the domain boundaries of the column of sub-pixels extend along the second direction. The touch signal line on the domain boundaries is coupled to the first through hole through a first connection line. The first connection line is in the same layer as the touch signal line, the gate line is in the same layer as the gate electrode of the transistor, the first connection line is on a side of the gate line away from the base substrate, and a second insulation layer is between the first connection line and the gate line.

In some embodiments, the first connection line includes a first connection sub-line and a second connection sub-line, the first connection sub-line couples the touch signal line to the second sub-connection line, and the second sub-connection line is coupled to the first through hole. The first sub-connection line extends along the first direction, and an orthographic projections of the first sub-connection lines on the base substrate overlaps an orthographic projections of the gate lines on the base substrate. An orthographic projection of the second sub-connection line on the base substrate is within the pixel region, and the orthographic projection of the second sub-connection line on the base substrate overlaps the orthographic projection of the first through hole on the base substrate.

In some embodiments, in the pixel region where no first through hole is formed, the plurality of slits on the second sub-electrode include a first slit set and a second slit set arranged along the second direction. The first slit set includes at least one slit, and the second slit set includes at least one slit. The second slit set and the transistor are arranged along the first direction. The touch signal line on the domain boundaries divides each of the at least one slit in the first slit set into two sub-slits, and divides each of the at least one slit in the second slit set into two sub-slits. A length of the sub-slit of the first slit set on a side of the touch signal line proximal to the transistor is greater than a length of the sub-slit of the first slit set on a side of the touch signal line away from the transistor. A length of the sub-slit of the second slit set on a side of the touch signal line proximal to the transistor is less than a length of the sub-slit of the second slit set on a side of the touch signal line away from the transistor.

In some embodiments, a length of the sub-slit of the first slit set on a side of the touch signal line away from the transistor is less than a length of the sub-slit of the second slit set on a side of the touch signal line away from the transistor.

In some embodiments, in a pixel region where the first through hole is formed, the plurality of slits on the second sub-electrode include a third slit set and a fourth slit set arranged along the second direction. The third slit set includes at least one slit, and the fourth slit set includes at least one slit. The third slit set and the first through hole are arranged along the first direction, and the fourth slit set and the transistor are arranged along the first direction. The touch signal line on the domain boundaries divides each of the at least one slit of the third slit set into two sub-slits, and divides the each of at least one slit of the fourth slit set into two sub-slits. A length of the sub-slit of the third slit set on a side of the touch signal line away from the first through hole is greater than a length of the sub-slit of the third slit set on a side of the touch signal line proximal to the first through hole. A length of the sub-slit of the fourth slit set on a side of the touch signal line proximal to the transistor is less than a length of the sub-slit of the fourth slit set on a side of the touch signal line away from the transistor.

In some embodiments, a length of the sub-slit of the third slit set on a side of the touch signal line proximal to the first through hole is less than a length of the sub-slit of the fourth slit set on a side of the touch signal line away from the transistor.

As a second aspect, a display device includes above display substrate is provided.

BRIEF DESCRIPTION OF DRAWINGS

The accompanying drawings, which provide a further understanding of the embodiments of the present disclosure, constitute a part of the specification, illustrate the present disclosure together with the embodiments of the present disclosure, and do not constitute a limitation on the present disclosure. The above and other features and advantages are more apparent to those skilled in the art by describing the detailed example embodiments with reference to the accompanying drawings, in which.

DETAIL DESCRIPTION OF EMBODIMENTS

Figure 1:
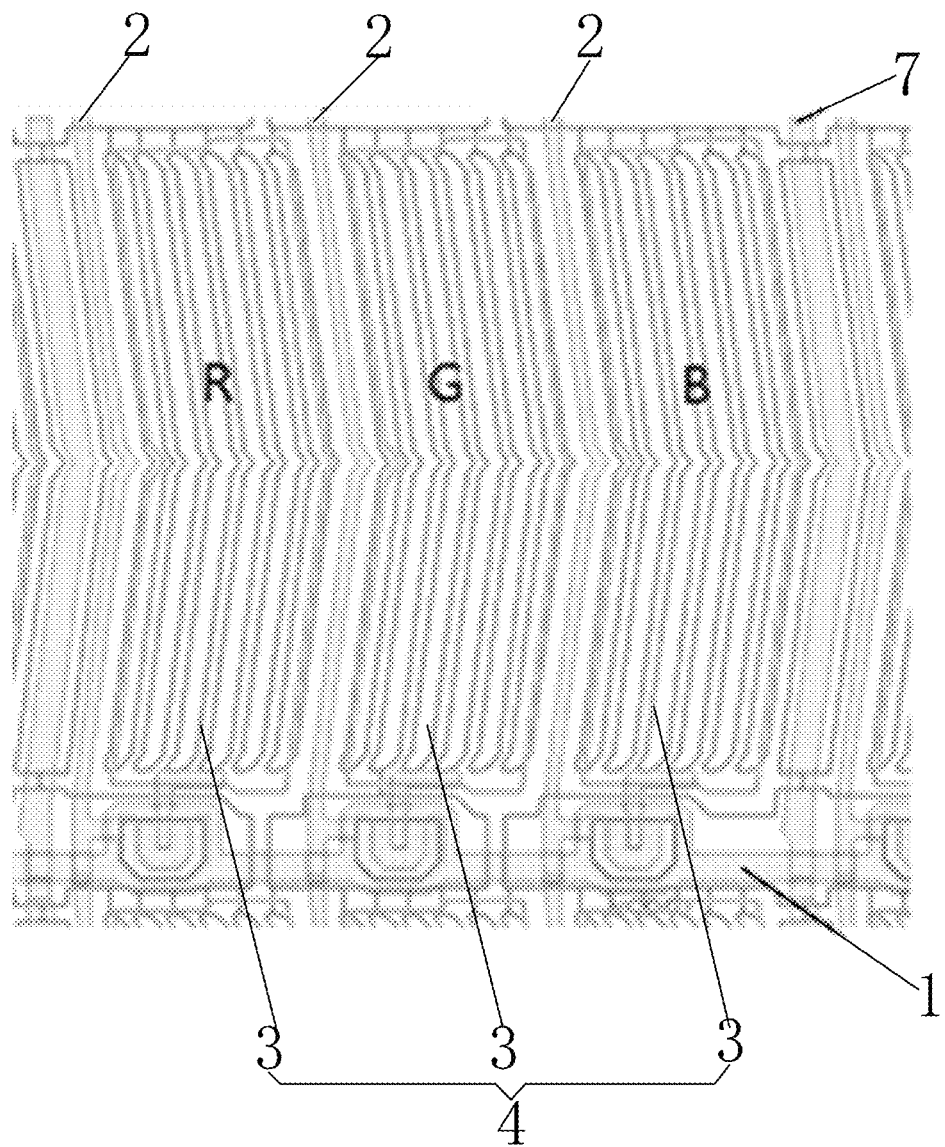
FIG. 1 is a schematic diagram showing a pixel design of a TDDI product in the related art.

In order to enable those skilled in the art to better understand the technical solutions of the embodiments of the present disclosure, a display substrate and a display device in the embodiments of the present disclosure will be described in further detail below with reference to the accompanying drawings and the detailed description.

The embodiments of the present disclosure will be described more fully hereinafter with reference to the accompanying drawings, but the embodiments illustrated may be embodied in different forms and should not be construed as limited to the embodiments set forth herein. Rather, these embodiments are provided so that this disclosure will be thorough and complete, and will fully convey the scope of the present disclosure to those skilled in the art.

The disclosed embodiments are not limited to the embodiments shown in the drawings, but include modifications of configurations based on a manufacturing process. Thus, the regions shown in the drawings have schematic properties, and the shapes of the regions shown in the drawings show specific shapes of the regions, but are not intended to be limiting.

The technical key point of the TDDI product is that the common electrode is divided into various blocks. Each of the common electrode blocks serves as a sensing block, and various touch signal lines are respectively coupled to corresponding sensing blocks. The capacitance of a sensing block changes when a finger touches the sensing block, and the change of the capacitance of the sensing block is transmitted to a processing chip through the touch signal line, so that finally the processing chip accurately judges a position of the touched sensing block and makes a corresponding response.

Referring to FIG. 1, which is a schematic diagram of a pixel design of a TDDI product in the related art is shown, one pixel 4 of the TDDI product includes three sub-pixels 3 (e.g., R, G, B sub-pixels, namely red, green, and blue sub-pixels), and the three sub-pixels 3 are coupled to and driven by the same gate line 1. The three sub-pixels 3 are respectively coupled to different data lines 2, so that the different data lines 2 respectively provide data driving signals for the sub-pixels 3. For example, in a product with a resolution of 1920×720, the product has 720 gate lines 1 and 1920×3=5760 data lines 2. A data driver chip (i.e., Source IC) used in the TDDI product has 1920 channels, and three data driver chips in total are required to drive all the sub-pixels 3 in the TDDI product.

Since a touch function is integrated in the data driver chip of the TDDI product, namely, the data driver chip not only provides a data driving signal, but also provides a touch driving signal. That is, both of the data lines 2 and the touch signal lines 7 are coupled to the data driver chip, so that the data driver chip of this type has a problem of high price, and thus the cost of the current TDDI product is high. A TDDI product that can reduce the number of data driver chips without changing the resolution is urgently required at present.

Figure 2A:
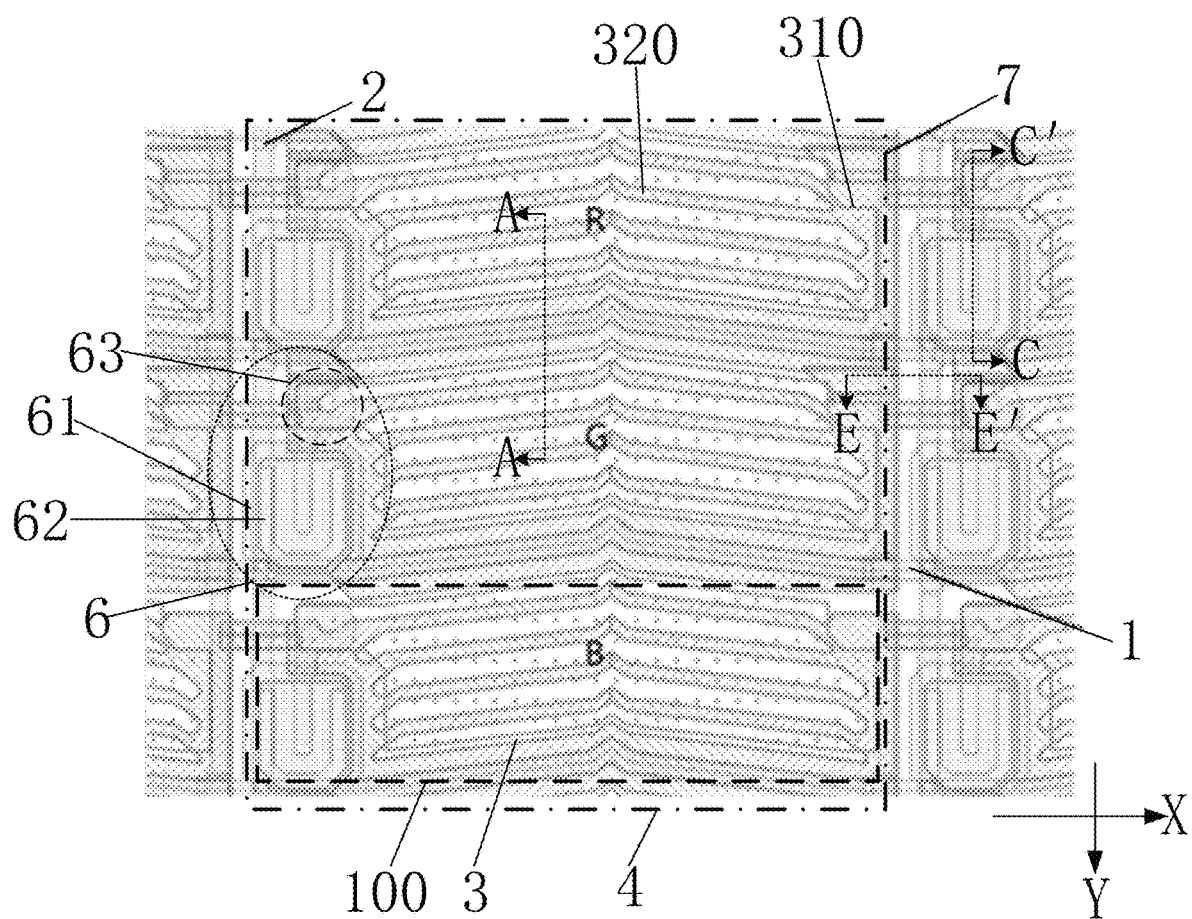
FIG. 2A is a schematic diagram showing a pixel structure and an arrangement of pixels of a display substrate according to an embodiment of the present disclosure.
Figure 3:
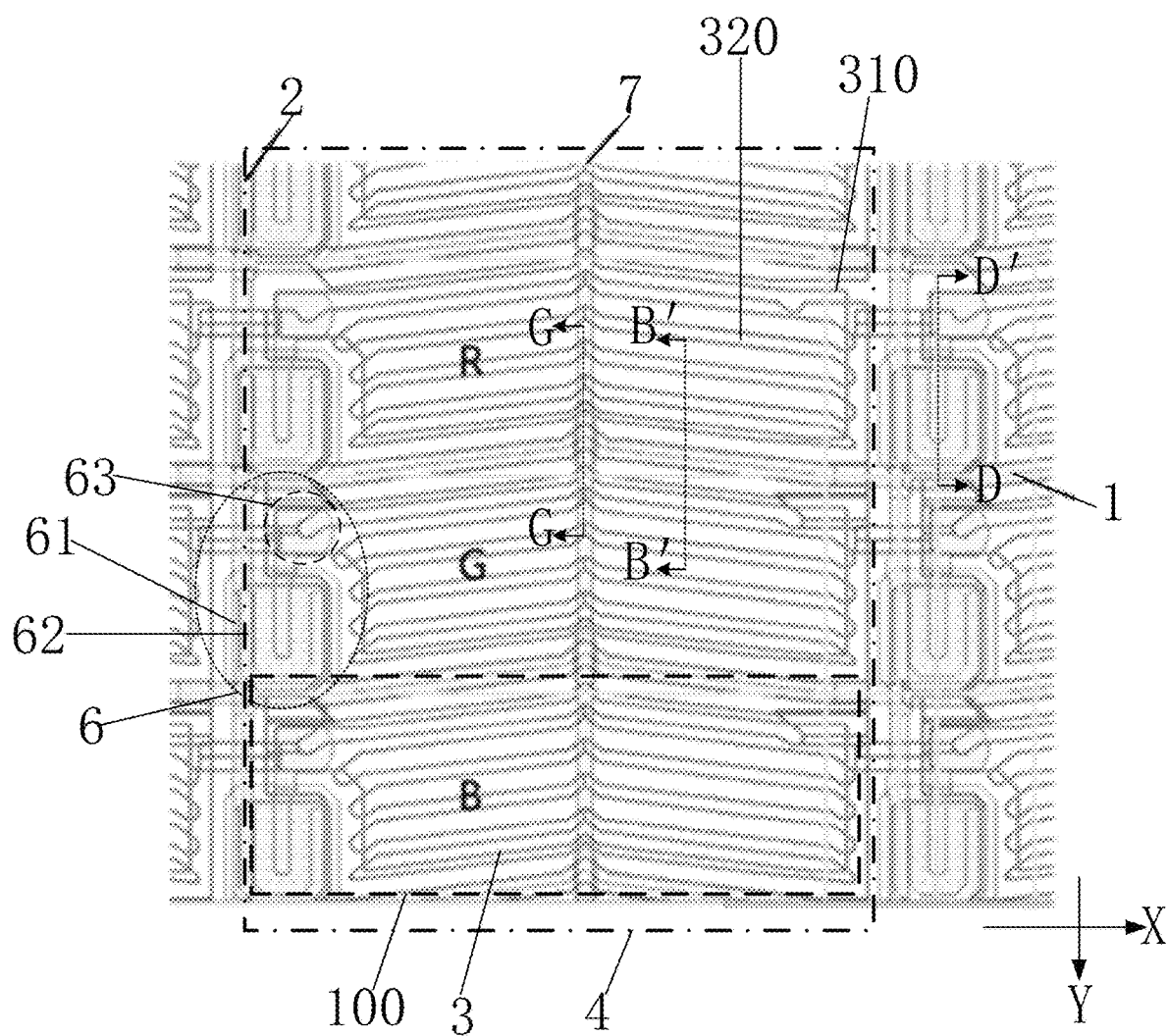
FIG. 3 is a schematic diagram showing a pixel structure and an arrangement of pixels of another display substrate according to an embodiment of the present disclosure.

FIG. 2A is a schematic diagram showing a pixel structure and an arrangement of pixels of a display substrate according to an embodiment of the present disclosure. FIG. 3 is a schematic diagram showing a pixel structure and an arrangement of pixels of another display substrate according to an embodiment of the present disclosure. In view of the above problems, referring to FIG. 2A and FIG. 3, an embodiment of the present disclosure provides a display substrate, including a plurality of gate lines 1 and a plurality of data lines 2. Each of the plurality of gate lines 1 extends along a first direction X, and each of the plurality of data lines 2 extends along a second direction Y. The plurality of data lines 2 and the plurality of gate lines 1 are crossed spatially to define a plurality of pixel regions 100. At least one sub-pixel 3 is disposed in each of the pixel regions 100. At least three sub-pixels 3 adjacent to each other along the second direction Y constitute one pixel 4, and all sub-pixels 3 within one pixel 4 are coupled to the same data line 2.

In some embodiments, the various sub-pixels 3 in one pixel 4 have different colors. For example, the three sub-pixels 3 form one pixel 4, and the colors of the three sub-pixels 3 are red R, green G and blue B, respectively, so as to realize the color display of the display substrate. The sub-pixel 3 in the pixel region 100 may further include other colors, such as white. The colors of the sub-pixels 3 forming one pixel 4 are not limited herein, and the modification on the colors of the sub-pixels 3 of any one of the pixels 4 is also within the protection scope of the present disclosure. The number of sub-pixels 3 in one pixel 4 is not limited, and the modification on the number of sub-pixels 3 in any one of the pixels 4 is also within the protection scope of the present disclosure.

In some embodiments, one sub-pixel 3 is disposed in each of the pixel regions 100. All the sub-pixels 3 of one pixel 4 are sequentially arranged along the second direction Y. All sub-pixels 3 of one pixel 4 are coupled to different gate lines 1, respectively. For example, the sub-pixels 3 in the three pixel regions 100 form one pixel 4. The colors of the sub-pixels 3 in the three pixel regions 100 are red, green and blue, respectively, and each of the red, green and blue sub-pixels 3 is coupled to one corresponding of the gate lines 1.

Compare with TDDI product in FIG. 1, in the above-mentioned structure of the pixel 4 in the display substrate in the embodiment, the number of gate lines 1 is three times of that in the TDDI product in FIG. 1, the number of data lines 2 is ⅓ of that in the TDDI product in FIG. 1, thereby greatly decreasing the number of the data lines 2 without changing the resolution of the display substrate. The data lines 2 are coupled to a data driver chip, so that the data driver chip provides data driver signals for the data lines 2, thereby greatly decreasing the number of the data driver chips used, and thus the cost of using the data driver chips.

Figure 2B:
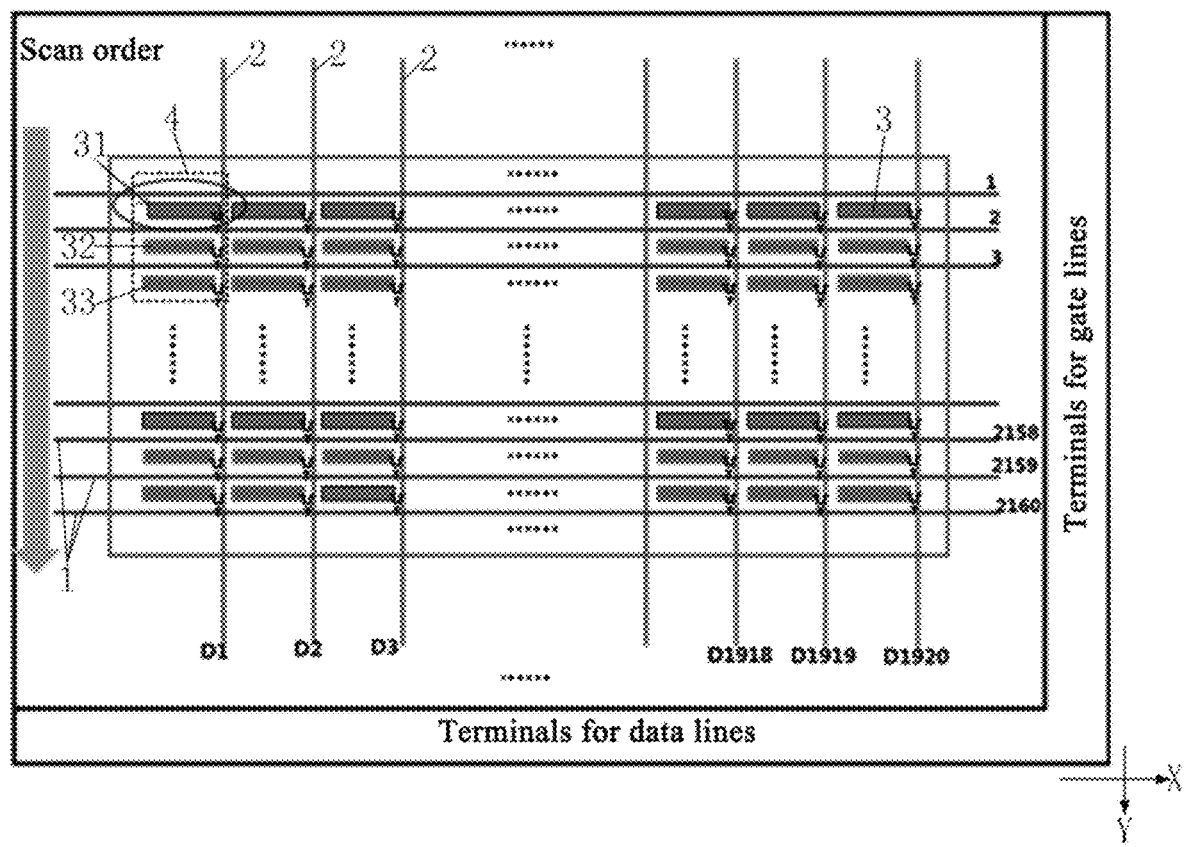
FIG. 2B is a schematic diagram of an arrangement of pixels and an operation principle of the display substrate in FIG. 2A.

In some embodiments, referring to FIG. 2B, which is a schematic diagram showing an arrangement of the pixels and operation principle of the display substrate in FIG. 2A, a plurality of pixels 4 in the display substrate are arranged in an array. Each of the pixels 4 includes three sub-pixels 3, namely a red sub-pixel 31, a green sub-pixel 32 and a blue sub-pixel 33. The three sub-pixels 3 are sequentially arranged along the second direction Y. In the pixel array, the sub-pixels 3 in each row are arranged along the first direction X, and the sub-pixels 3 in each column are arranged along the second direction Y. The sub-pixels 3 in each row are coupled to one gate line 1, and the sub-pixels 3 in each column are coupled to one data line 2. A gate driving chip (not shown) disposed in a peripheral border region of the display substrate provides a scan signal to the gate lines 1, and a data driving chip (not shown) disposed in the peripheral border region provides the data driving signals to the data lines 2, respectively. When the display substrate displays, the gate lines 1 are scanned one by one from top to bottom along the second direction Y. When scanning is performed on each of the gate lines 1, the data driving signals are simultaneously input to all the data lines 2 so as to simultaneously lighten the sub-pixels 3 in each row. When scanning is performed on the last gate line 1, the displaying of one frame of picture in the display substrate is finished.

Figure 4:
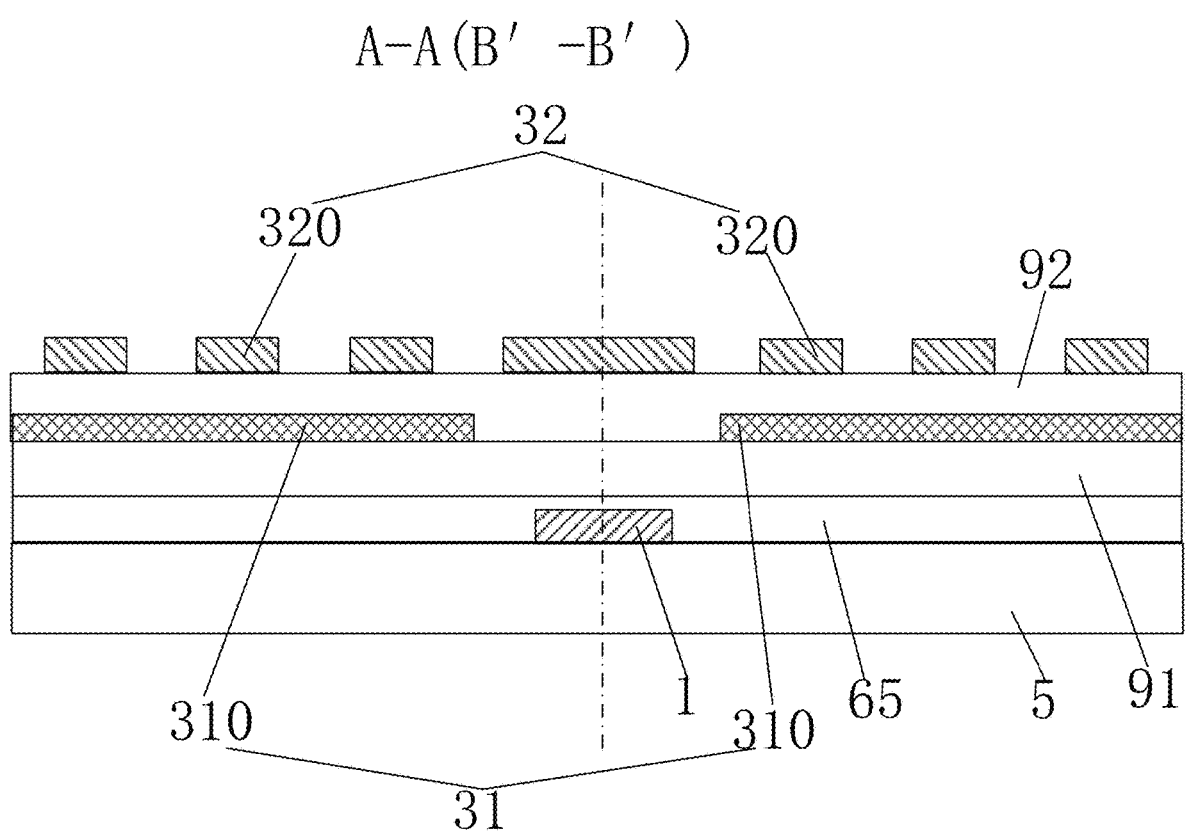
FIG. 4 is a sectional view showing a structure of the display substrate taken along a line AA in FIG. 2A or a line B'B' in FIG. 3.
Figure 5A:
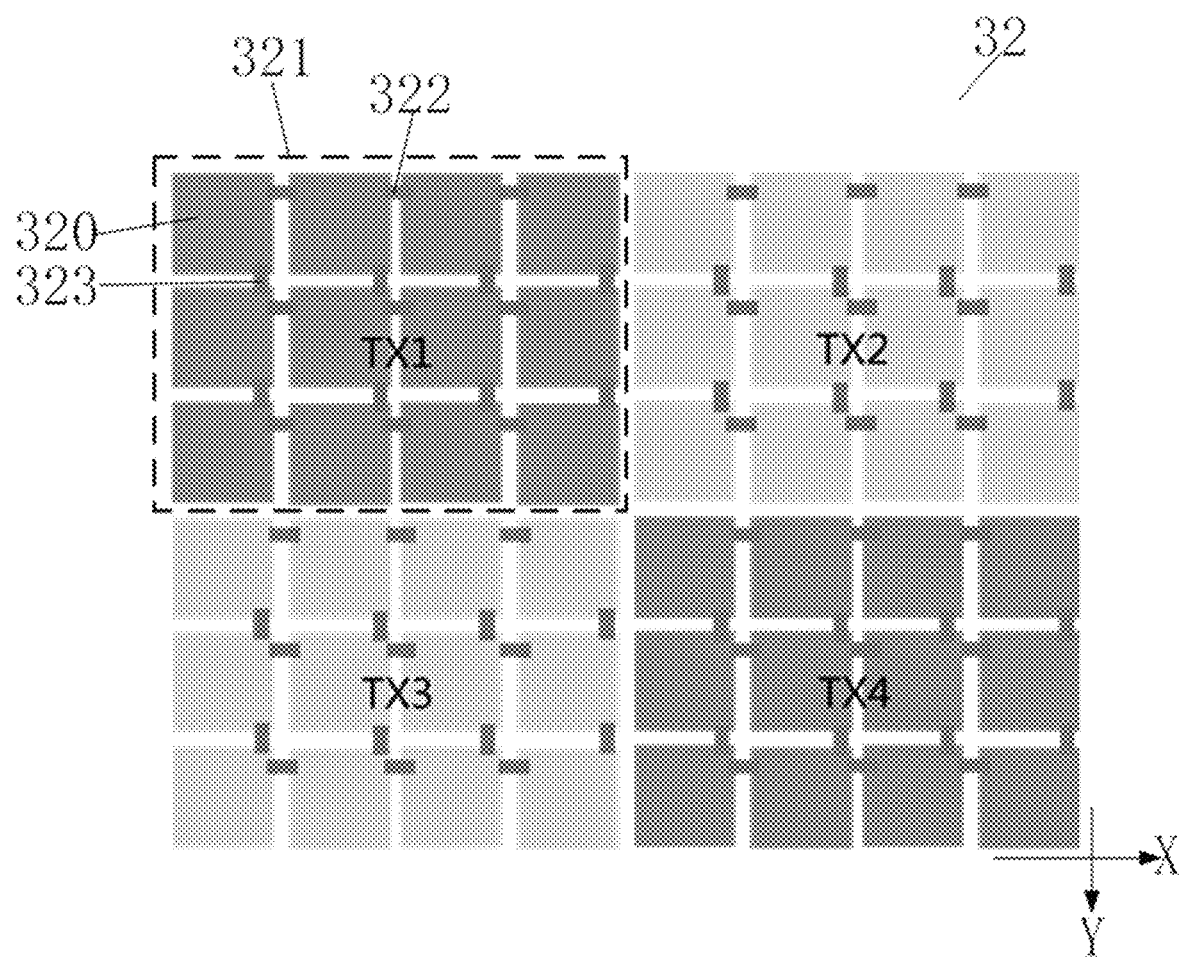
FIG. 5A is a schematic diagram showing second block electrodes of a display substrate according to an embodiment of the present disclosure.

FIG. 4 is a cross-sectional view of the structure of the display substrate taken along a line AA in FIG. 2A or a line B'B' in FIG. 3. FIG. 5A is a schematic diagram showing second block electrodes of the display substrate according to an embodiment of the present disclosure. In some embodiments, referring to FIG. 4 and FIG. 5A, the display substrate further includes a base substrate 5. Each of the pixels 4 includes a first electrode 31 and a second electrode 32 disposed on the base substrate 5 and sequentially disposed away from the base substrate 5. The first electrode 31 includes a plurality of first sub-electrodes 310, an orthographic projection of each of the first sub-electrodes 310 on the base substrate 5 is located in the pixel region. The second electrode 32 includes a plurality of second sub-electrodes 320, and an orthographic projection of each of the second sub-electrodes 320 on the base substrate 5 is at least partially located in the pixel region. The orthographic projection of the first sub-electrodes 310 on the base substrate 5 at least partially overlaps the orthographic projection of the second sub-electrode 320 on the base substrate 5. The second sub-electrodes 320 adjacent to each other along the first direction X and the second direction Y are coupled to each other to form a second block electrode 321 (i.e., a touch electrode block, such as TX1, TX2, TX3, or TX 4). The number of the second block electrodes 321 is less than the number of the second sub-electrodes 320. The second block electrodes 321 may serve as touch electrodes. Therefore, the display substrate is integrated with a touch function.

In some embodiments, multiple second sub-electrodes 320 adjacent to each other along the first direction X are coupled to each other to form the second block electrode 321. In some embodiments, multiple second sub-electrodes 320 adjacent to each other along the second direction Y are coupled to each other to form the second block electrode 321.

Figure 6:
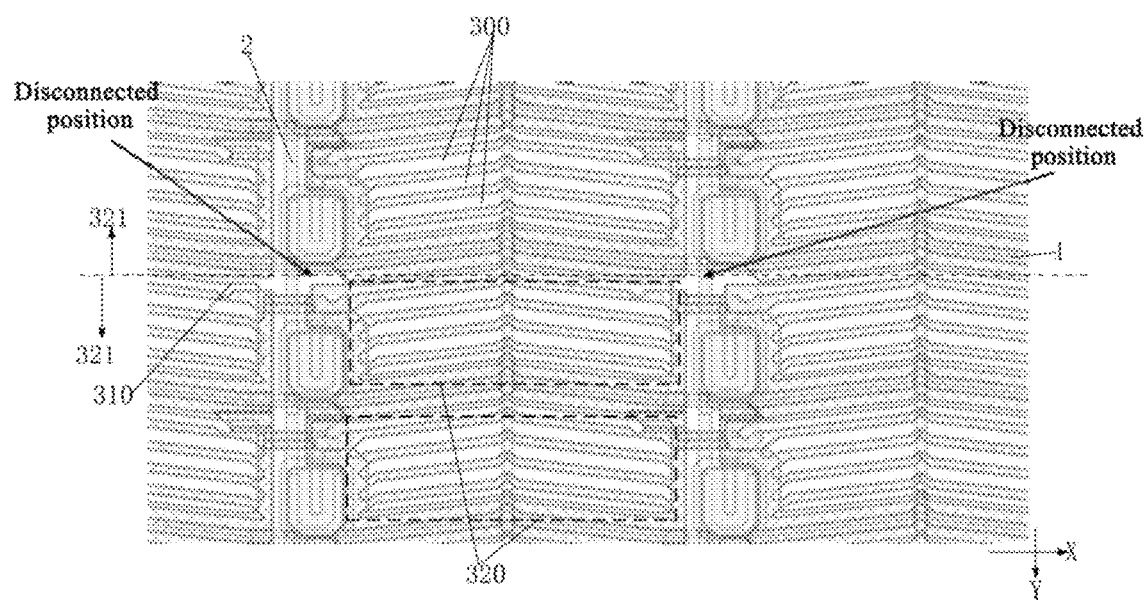
FIG. 6 is a schematic top view showing a structure in which two second block electrodes adjacent to each other along a second direction are spaced apart from each other in an embodiment of the present disclosure.

In some embodiments, referring to FIG. 6 which is a schematic top view of a structure in which two second electrodes adjacent to each other along the second direction are spaced apart from each other in an embodiment of the present disclosure, a plurality of second block electrodes 321 are arranged in an array. Each of the second block electrodes 321 includes the same number of second sub-electrodes 320. The second sub-electrodes 320 in each of the second block electrodes 321 are arranged in an array. Each of the second sub-electrodes 320 has a plurality of gaps 300 formed therein. The plurality of gaps 300 are arranged at intervals along the second direction Y. Each of the plurality of gaps 300 extends along the first direction X. In two adjacent rows of the second sub-electrodes 320 in two rows of the second block electrodes 321 adjacent to each other along the second direction Y, one row of the second sub-electrodes 320 is disconnected from the other row of the second sub-electrodes 320. Therefore, the disconnection between two adjacent second block electrodes 321 along the second direction Y can be realized, and further the second electrodes 32 can be divided into a plurality of second block electrodes 321 along the second direction Y.

In some embodiments, an orthographic projection of a gap between two adjacent second block electrodes 321 along the second direction Y on the base substrate 5 does not overlap an orthographic projection of the gate line 1 on the base substrate 5, and the orthographic projection of the gap between two adjacent second block electrodes 321 along the second direction Y on the base substrate 5 overlaps an orthographic projection, on the base substrate 5, of an edge of one row of the first sub-electrodes 310 along an edge of one of the two adjacent second block electrodes 321 along the first direction X.

Figure 5B:
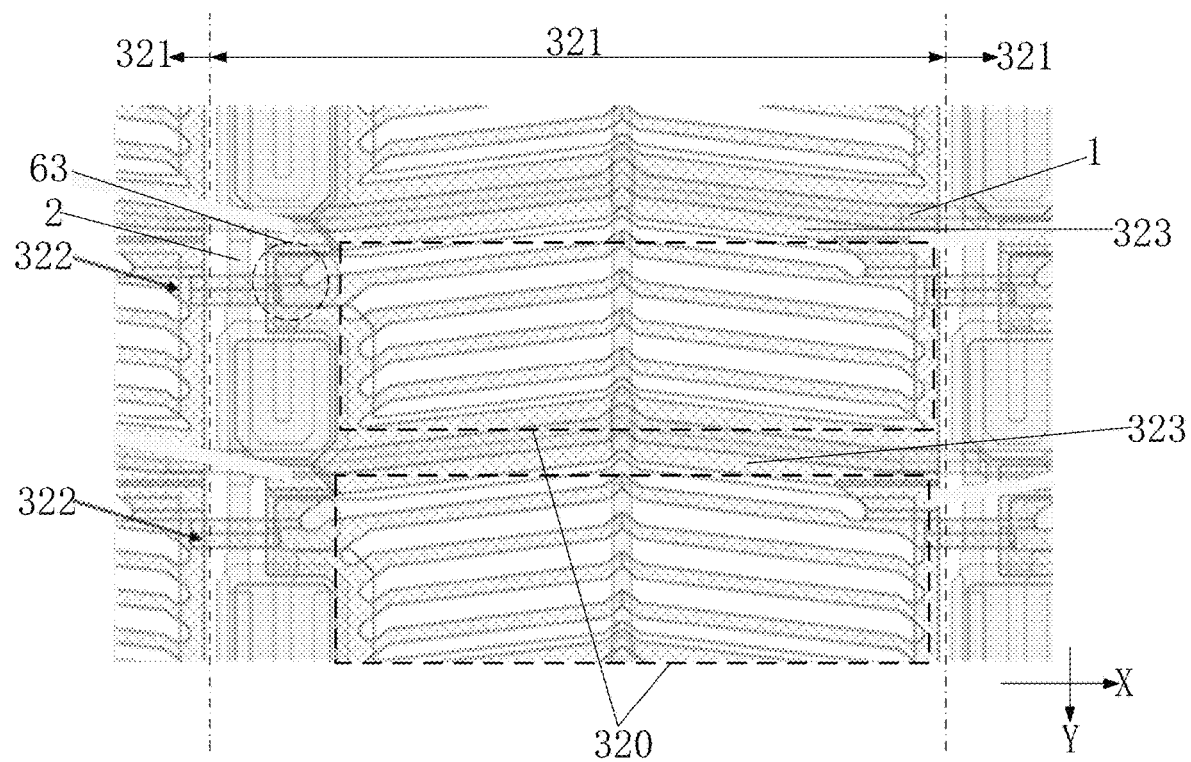
FIG. 5B is a schematic diagram showing an interconnection between second sub-electrodes of a second block electrode.
Figure 7A:
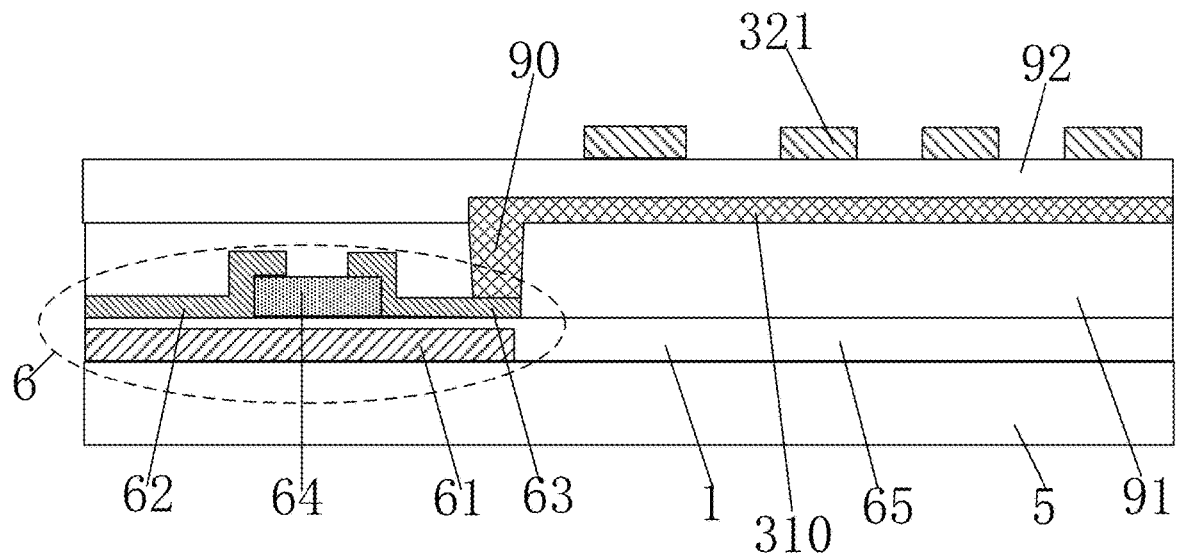
FIG. 7A is a cross-sectional view of a structure taken along a line CC' in FIG. 2A or a line DD' in FIG. 3.
Figure 8:
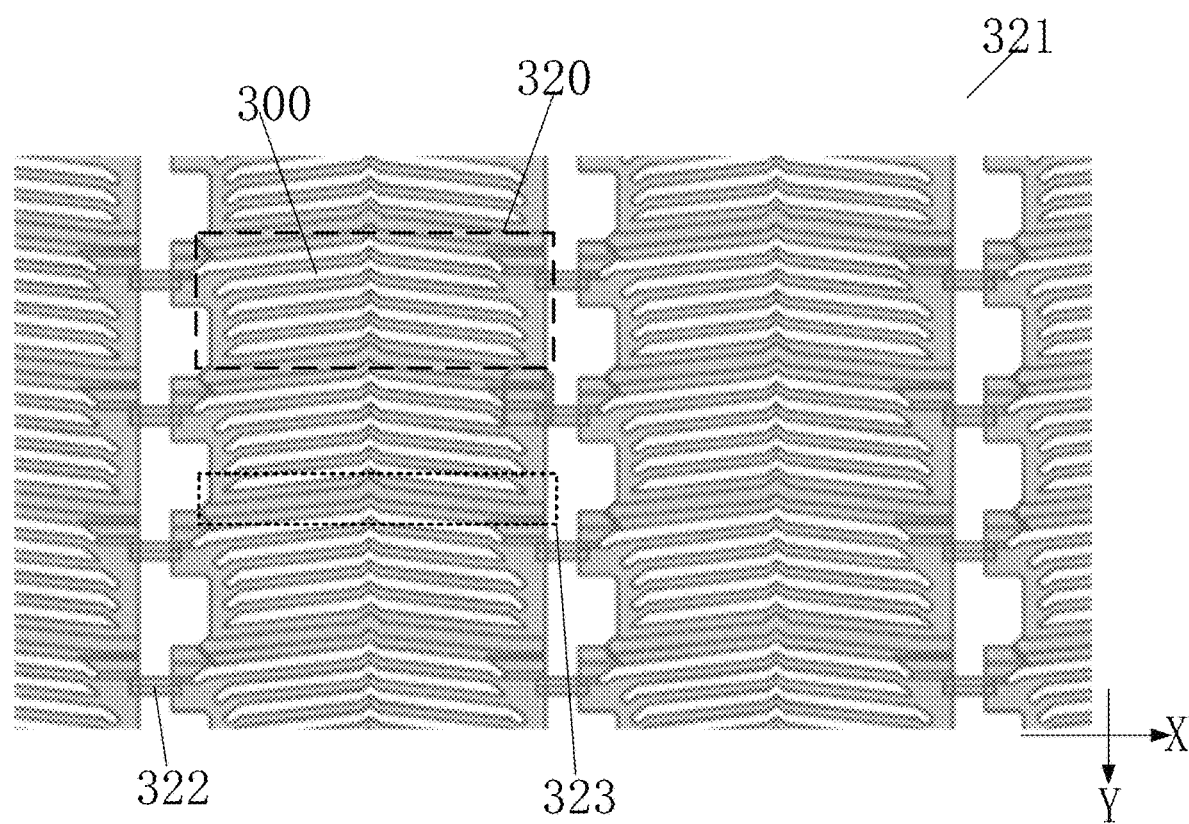
FIG. 8 is a schematic top view showing a structure of a second electrode in an embodiment of the present disclosure.

FIG. 5B is a schematic diagram showing an interconnection between second sub-electrodes of a second block electrode. FIG. 7A is a cross-sectional view of a structure taken along a line CC' in FIG. 2A or a line DD' in FIG. 3. FIG. 8 is a schematic top view of a structure of a second electrode in an embodiment of the present disclosure. In some embodiments, referring to FIG. 2A, FIG. 3, FIG. 5A, FIG. 5B, FIG. 7A and FIG. 8, the display substrate further includes a plurality of transistors 6, and each of the sub-pixels 3 includes one transistor 6. The transistor 6 is positioned at the position where the data line 2 intersects the gate line 1. An orthographic projection of the transistor 6 on the base substrate 5 is between an opening region of the sub-pixel 3 including the transistor and an orthographic projection of the data line 2 coupled to the sub-pixel 3 on the base substrate 5. A gate electrode 61 of the transistor 6 is disposed proximal to the gate line 1 coupled to the transistor 6, a source electrode 62 of the transistor 6 is disposed proximal to the data line 2 coupled to the transistor 6, and a drain electrode 63 of the transistor 6 is disposed proximal to a gate electrode 61 of another transistor 6 adjacent to the transistor 6 along the second direction Y and the drain electrode 63 is coupled to the first sub-electrode 310. Referring to FIG. 5A and FIG. 5B, two second sub-electrodes 320 adjacent to each other along the first direction X in the second block electrode 321 are coupled to each other via a first connection portion 322. The first connection portion 322 extends along the first direction X, and an orthographic projection of the first connection portion 322 on the base substrate 5 intersects an orthographic projection of the data line 2 on the base substrate 5. With the first connection portion 322, the connection between the second sub-electrodes 320 adjacent to each other along the first direction X in each of the second block electrodes 321 can be realized.

It should be noted that, referring to FIG. 5A and FIG. 5B, no first connection portion is formed between two second block electrodes 321 adjacent to each other along the first direction X, thereby realizing the division of the second electrode 32 into the plurality of second block electrodes 321 along the first direction X.

In some embodiments, a width of the transistor 6 along the second direction Y is 28 μm, and a length of the transistor 6 along the first direction X is 4 μm. The width and the length of the transistor 6 is determined by comprehensively considering the aperture ratio of the display substrate and the charging rate of the sub-pixel 3.

In some embodiments, the first connection portion 322 is located at the same layer as the second sub-electrode 320.

In some embodiments, referring to FIG. 5A, FIG. 5B and FIG. 8, the display substrate further includes a second connection portion 323 configured to couple two second sub-electrodes 320 adjacent to each other along the second direction Y in the second block electrode 321. With the second connection portion 323, the connection between the second sub-electrodes 320 adjacent to each other along the second direction Y in the second block electrode 321 can be realized. In some embodiments, an orthographic projection of the second connection portion 323 on the base substrate 5 overlaps an orthographic projection of the gate line 1 on the base substrate 5.

Figure 9:
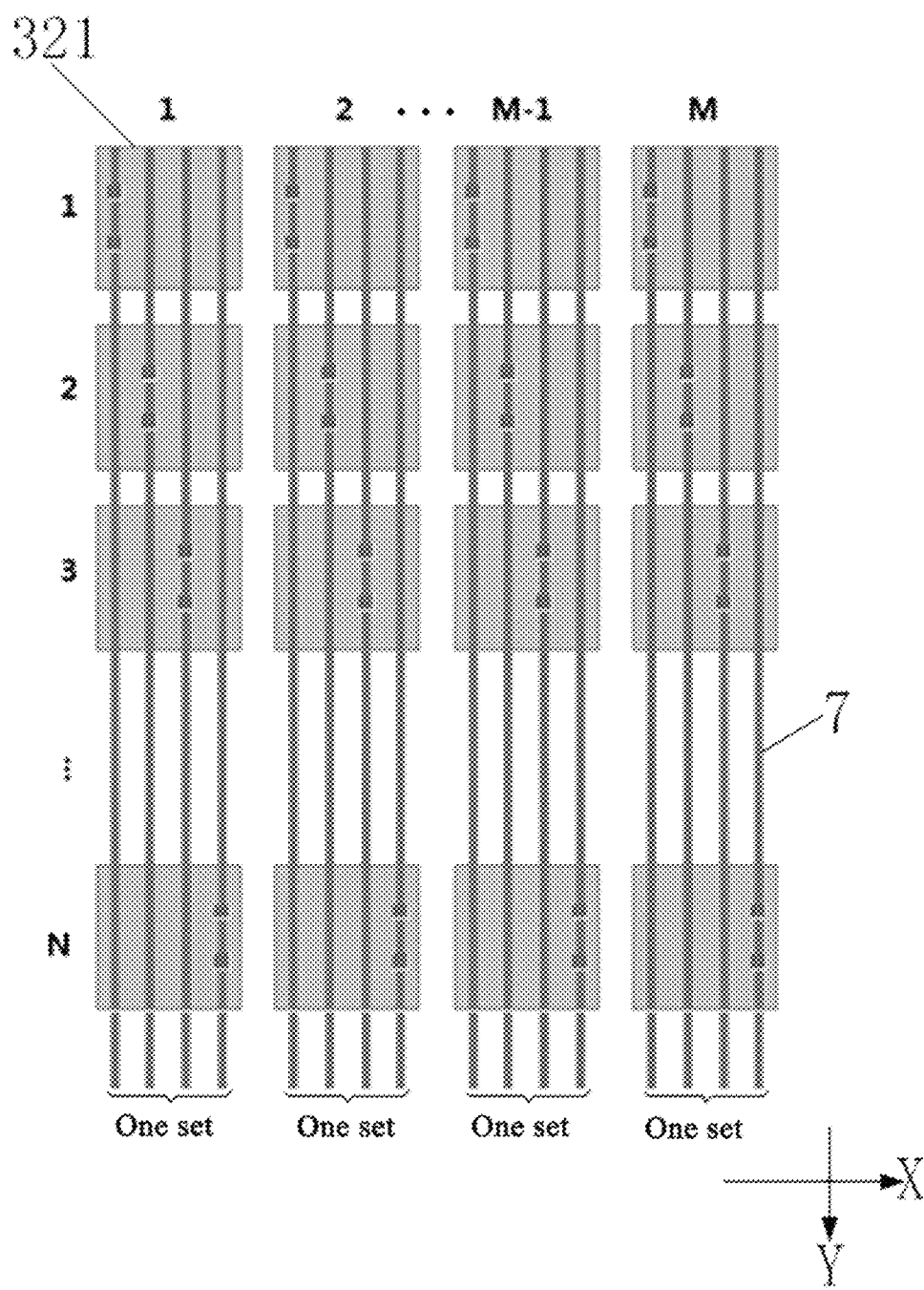
FIG. 9 is a schematic diagram showing an arrangement of touch signal lines in an embodiment of the present disclosure.

In some embodiments, referring to FIG. 2A, FIG. 3, and FIG. 9, which is a schematic diagram showing an arrangement of touch signal lines in an embodiment of the present disclosure, the display substrate further includes a plurality of touch signal line sets/a plurality of sets of touch signal lines 7, and each of the touch signal line sets 7 includes a plurality of touch signal lines 7 each extending along the second direction Y. Each of the touch signal line sets 7 corresponds to one column of the second block electrodes 321, and each of the second block electrodes 321 is correspondingly coupled to at least one touch signal line 7.

In some embodiments, each of the second block electrodes 321 is correspondingly coupled to two touch signal lines 7.

In some embodiments, the plurality of second block electrodes 321 arranged along the first direction X and the second direction Y each form a capacitor with ground, that is, the second block electrodes 321 in the embodiment implement a touch function of the display substrate by using a self-capacitance principle. When a finger touches a second block electrode 321, the capacitance of the finger will be superimposed on the capacitance of the second block electrode 321, so that the capacitance of the second block electrode 321 is increased. During touch detection, by detecting an array formed by the second block electrode 321 arranged along the first direction X and the second direction Y in sequence, the horizontal coordinate and the vertical coordinate of the touch position may be determined, respectively, according to the capacitance change of the second block electrodes 321 before and after touch; and then the horizontal coordinate and the vertical coordinate of the touch position are combined into a touch coordinate in a plane It should be noted that the second electrode may also be formed into a transverse electrode and a longitudinal electrode crossing each other, and the transverse electrode and the longitudinal electrode crossing each other form a mutual capacitance at the crossing position, that is, the two electrodes respectively form two electrode plates of a capacitor. When a finger touches the mutual capacitance screen, the coupling between the two electrodes near the touch point is affected, thereby changing the capacitance between the two electrodes. In the embodiment of the present disclosure, the structural improvement of the display substrate with self-capacitance touch is emphasized, therefore the display substrate with mutual capacitive touch is not described in detail In some embodiments, referring to FIG. 2A, the plurality of sub-pixels 3 are arranged in an array. One data line 2 and one touch signal line 7 are disposed between any two adjacent columns of sub-pixels 3. With the arrangement, the uniform signal coupling between the data lines 2 and the touch signal line 7 between any two adjacent columns of the sub-pixels 3 can be ensured, so that the display image displayed by the display substrate are uniform.

In some embodiments, the number of the touch signal lines may be less than the number of the data lines, in this case, one data line and one touch signal line may be disposed between a part of two adjacent columns of sub-pixels. For example, one data line and one touch signal line are disposed between two adjacent columns of sub-pixels among every n columns of sub-pixels, thereby ensuring basically uniform display image of the display substrate.

In some embodiments, the line width of the gate line 1 ranges from 4 μm to 6 μm, and the widths of the gate lines 1 of the display substrates with different resolutions are designed differently. The line width of the data line 2 ranges from 3 μm to 5 μm, and the widths of the data lines 2 of the display substrates with different resolutions are designed differently. The line width of the touch signal line 7 ranges from 3 μm to 4 μm, and the widths of the touch signal lines 7 of the display substrates 7 with different resolutions are designed differently. The distance between the touch signal line 7 and the data line 2 between two adjacent columns of sub-pixels 3 ranges from 4 μm to 6 μm. The distance between the touch signal line 7 and the data line 2 is determined by the load of the data line 2. If the distance is too large, the aperture ratio of the display substrate may be affected. If the distance is too small, the load of the data line 2 may increase: or if the distance is too small, it is easy to cause metal residues in the gap between the data line 2 and the touch signal line 7 during the preparation process, resulting in a short circuit between the data line 2 and the touch signal line 7.

Figure 10:
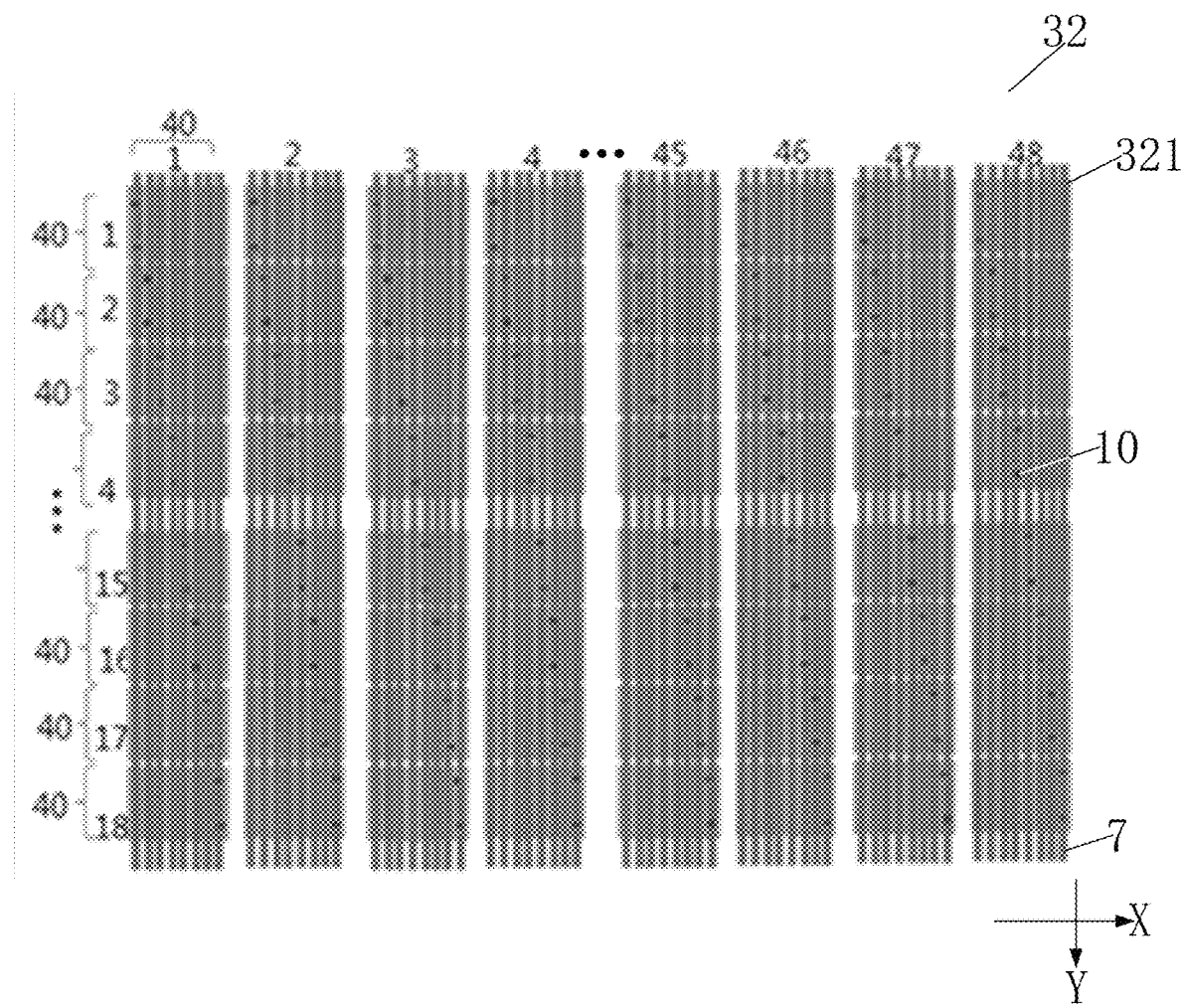
FIG. 10 is a schematic diagram showing an arrangement of second block electrodes and touch signal lines in a display substrate according to an embodiment of the present disclosure.
Figure 11:
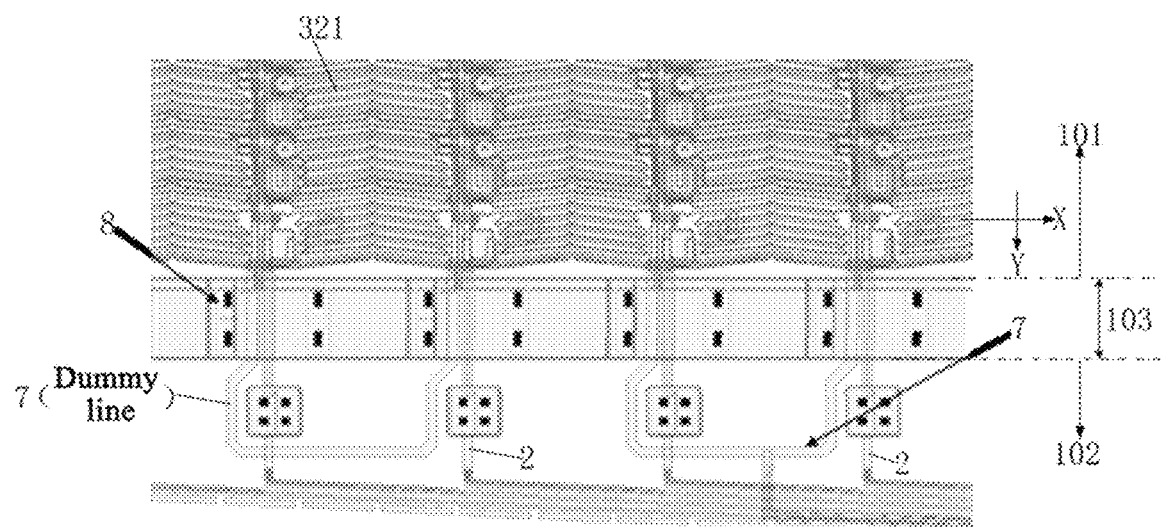
FIG. 11 is a schematic diagram showing a case where a part of the touch signal lines are coupled to a data driver chip and the other part of the touch signal lines are coupled to a common voltage terminal according to an embodiment of the present disclosure.

FIG. 10 is a schematic diagram showing an arrangement of the second electrodes and the touch signal lines in the display substrate according to an embodiment of the present disclosure. FIG. 11 is a schematic diagram showing a case where a part of the touch signal lines are coupled to the data driver chip and the other part of the touch signal lines are coupled to a common voltage terminal according to an embodiment of the present disclosure. In an embodiment, referring to FIG. 10 and FIG. 11, the display substrate has a resolution of 1920 multiplied by 720 (i.e., 1920×720). Each of the pixels of the display substrate includes one red sub-pixel, one green sub-pixel, and one blue sub-pixel. The second electrode 32 includes 48 (arranged along the first direction X)×18 (arranged along the second direction Y) second electrodes 321 arranged in an array. Each of the second block electrodes 321 corresponds to 40 (arranged along the first direction X)×40 (arranged along the second direction Y) pixels arranged in an array. One touch signal line 7 (i.e., TX line) is disposed between any two adjacent columns of the pixels arranged along the second direction Y. Each of the second block electrodes 321 is coupled to two touch signal lines 7. Each of the touch signal line sets 7 includes 40 touch signal lines. Each of the touch signal line sets 7 corresponds to a column of second block electrodes 321 arranged along the second direction Y. Any column of second electrodes 321 arranged along the second direction Y includes eighteen second block electrodes 321. The eighteen second block electrodes 321 in one column are coupled to thirty-six touch signal lines 7 in the set of touch signal lines 7, and the thirty-six touch signal lines 7 are routed from the display region 101 to the fan-out region 102 in the display substrate and are coupled to the data driver chip in the fan-out region 102. On one hand, the data driver chip provides the data driving signals for the data lines 2 and provides a common voltage signal for the touch signal lines 7 when the display substrate displays; and on the other hand, the data driver chip provides a touch driving signal for the touch signal lines 7 when the display substrate performs a touch function. The remaining four touch signal lines 7 (i.e., dummy lines) in each of the touch signal line sets 7 are not coupled to the second block electrodes 321. The remaining four touch signal lines 7 in each of the touch signal line sets 7 are routed from the display region 101 in the display substrate to the third region 103 between the display region 101 and the fan-out region 102 and are directly coupled to the common voltage terminal 8 in the third region 103. The common voltage terminal 8 supplies a common voltage signal to the remaining four touch signal lines 7 in each of the touch signal line sets 7 during displaying of the display substrate. In an embodiment, the remaining four touch signal lines 7 in each of the touch signal line sets 7 are respectively disposed at the left and right sides, along the first direction X, of the thirty-six touch signal lines 7 in the touch signal line set. For example, the remaining four touch signal lines 7 are disposed half to half at the left and right sides, along the first direction X, of the thirty-six touch signal lines 7 in the touch signal line set, respectively, thereby ensuring that a touch signal line set 7 corresponding to a column of second block electrodes 321 are uniformly distributed.

It should be noted that the number of the touch signal lines 7 in the touch signal line set 7 may alternatively be an integral multiple of the number of the second block electrodes 321 in a column of second electrodes 321 arranged along the second direction Y. The touch signal lines 7 in each of the touch signal line set 7 are all coupled to various second block electrodes 321 respectively, and there are no remaining touch signal lines 7 that are not coupled to the second block electrodes 321.

In some embodiments, the number of the second block electrodes 321 of the second electrode 32 may be adjusted according to the touch of the display substrate. The number of the touch signal lines 7 may alternatively be adjusted according to the number of the second block electrodes 321. In the embodiment, the number of the second block electrodes 321 and the number of the touch signal lines 7 are not limited. As long as each of the second block electrode 321 is connected to at least one touch signal line 7, the touch signal in the various second block electrodes 321 can be sensed Referring to table 1, the parameter settings of the second block electrodes and the touch signal lines in the display substrate with a resolution of 1920×720 in an embodiment of the present disclosure are shown.

TABLE 1

| Item | Triple gate line |
| --- | --- |
| Channels for touch signal lines | 48 columns*18 rows |
| Number of pixels corresponding to the second block electrode | 40 × 40 |
| Size of the second block electrode (mm) | 5.076 × 5.076 |
| Touch signal lines | 36TX + 4Dummy |
| Width of the touch signal line(μm) | 3 |
| Dummy connection | Vcom |

In the embodiment of the present disclosure, since the data driver chip integrates both the display driving function and the touch driving function, the data driver chip has a higher price cost. However, in the display substrate with the same resolution, the number of the data lines in the display substrate in the embodiment of the present disclosure is ⅓ of the number of the data lines in the prior art, and the number of the touch signal lines in the display substrate in the embodiment of the present disclosure is ⅓ of the number of the touch signal lines in the prior art, so that the number of the channels of the data driver chip coupled to the data lines and the number of the channels coupled to the touch signal lines can be both greatly reduced compared with the number in the prior art, thereby greatly decreasing the number of the used data driver chips with a certain number of channels, and thus the cost of using the data driver chips.

Figure 12:
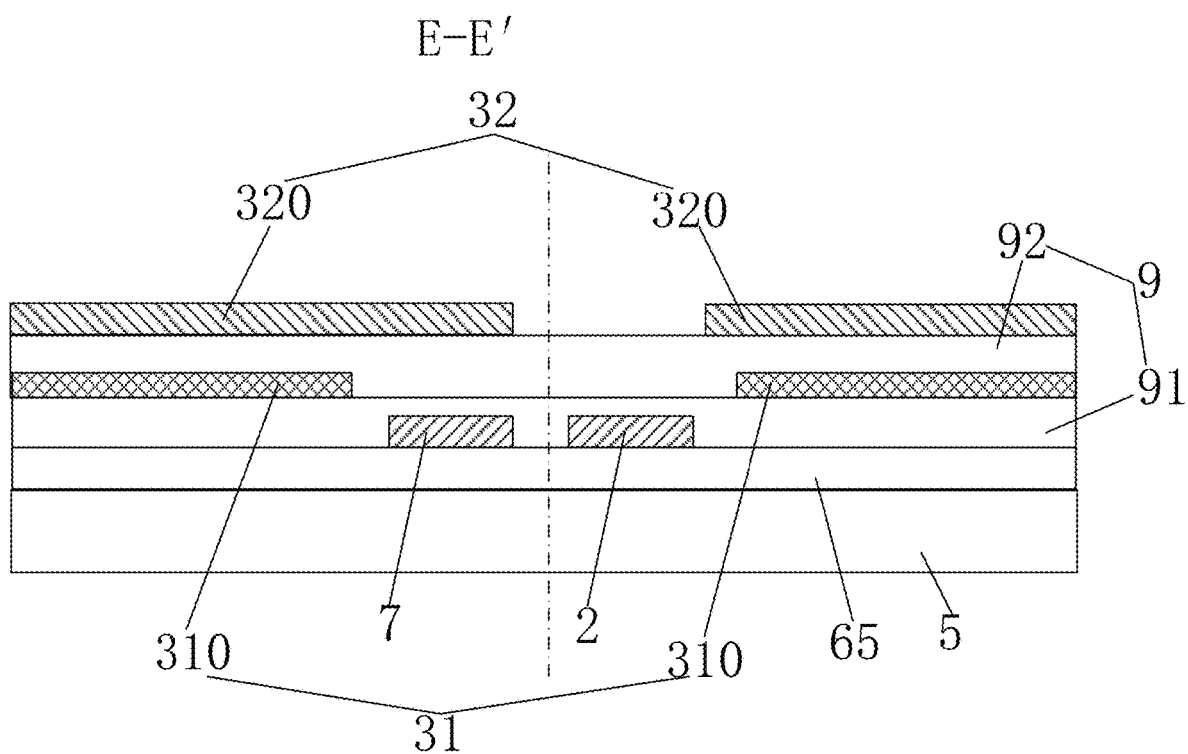
FIG. 12 is a sectional view of a structure taken along a line EE' in FIG. 2A.
Figure 13:
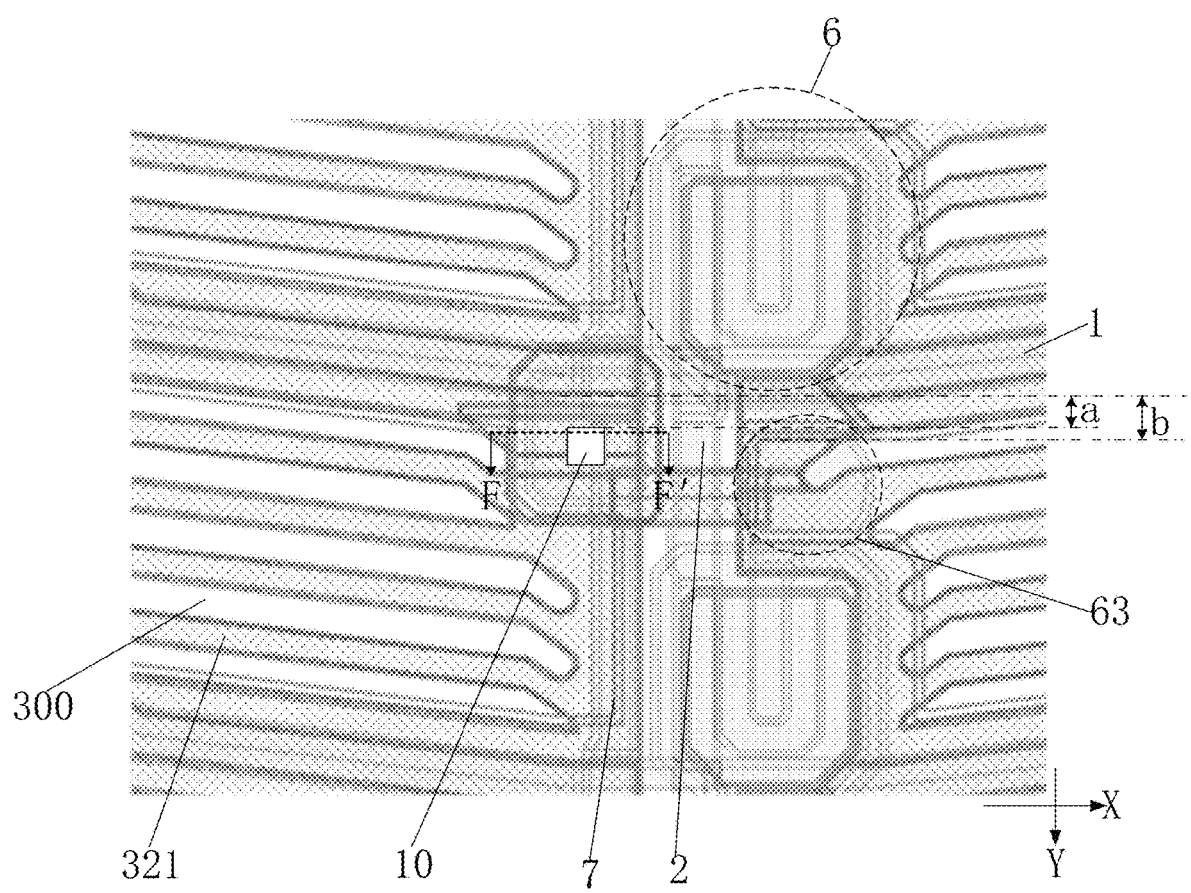
FIG. 13 is an enlarged top view of a local structure at a positon of a first through-hole in a display substrate in an embodiment of the present disclosure.
Figure 14:
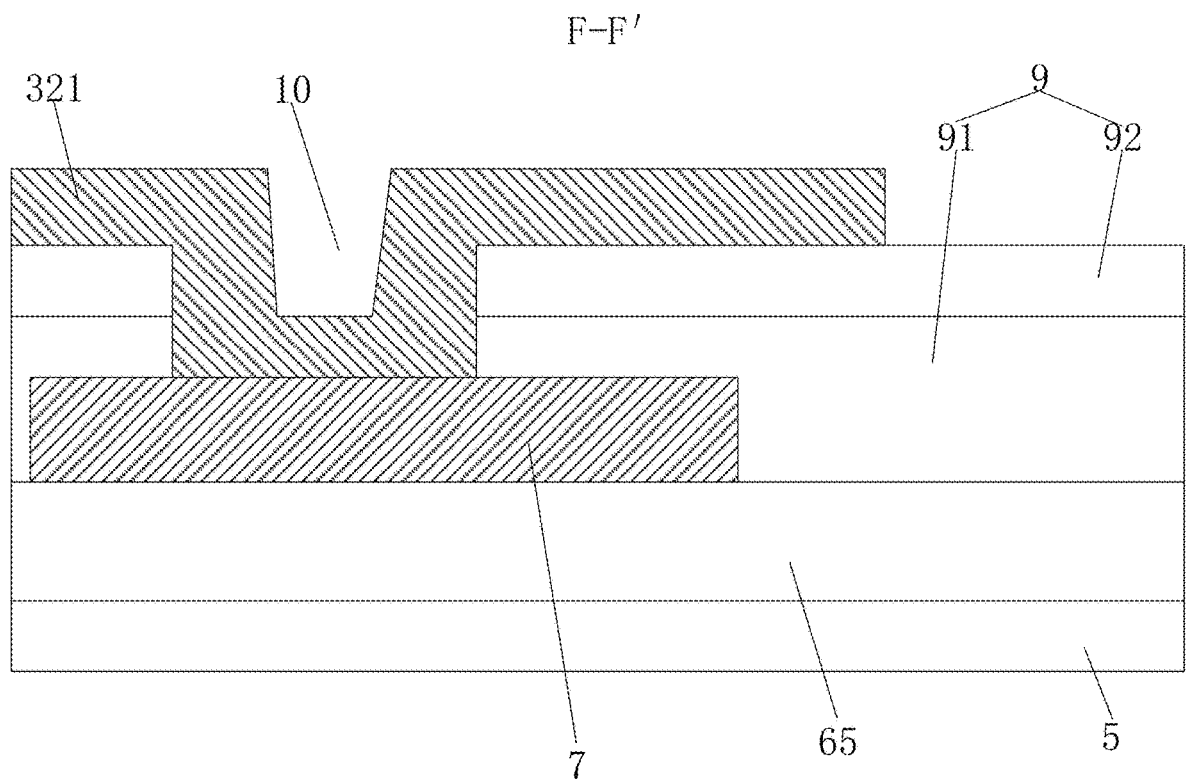
FIG. 14 is a sectional view of a structure taken along a line FF' in FIG. 13.
Figure 15:
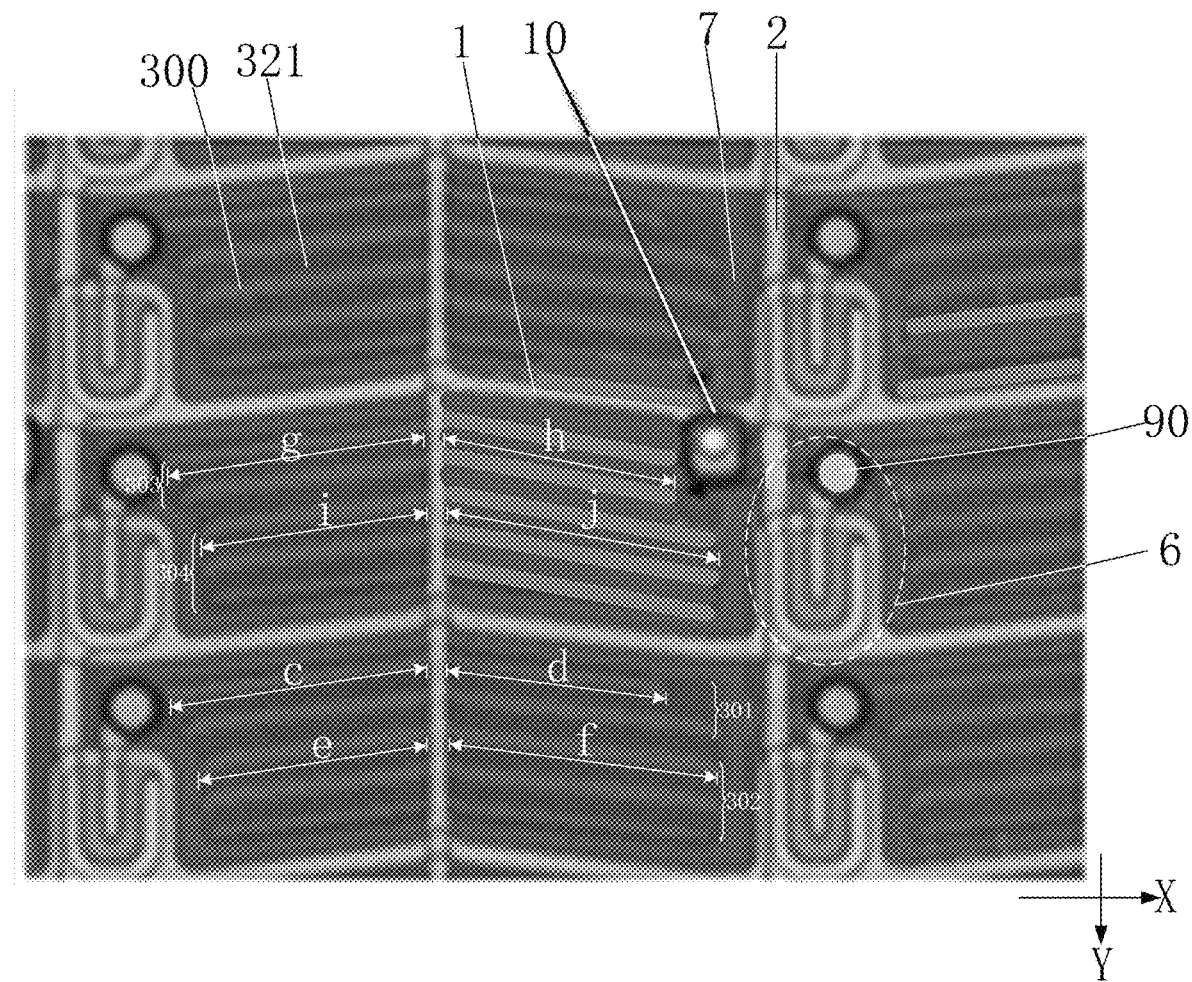
FIG. 15 is a top view of a pixel structure in a pixel region with a first through hole disposed in a display substrate according to an embodiment of the present disclosure.

FIG. 12 is a cross-sectional view of a structure taken along a line EE' in FIG. 2A: FIG. 13 is an enlarged top view of a local structure at a positon of a first through-hole in the display substrate in an embodiment of the present disclosure: FIG. 14 is a sectional view of a structure taken along a line FF' in FIG. 13; FIG. 15 is a top view of a pixel structure in a pixel region with a first through hole disposed in a display substrate according to an embodiment of the present disclosure. In some embodiments, referring to FIG. 12, FIG. 13, FIG. 14 and FIG. 15, the touch signal line 7, the data line 2, and the source electrode and the drain electrode of the transistor are located in the same layer. The second block electrode 321 is located on a side of the touch signal line 7 away from the base substrate 5. A first insulation layer 9 is disposed between the second block electrode 321 and the touch signal line 7. The second block electrode 321 is coupled to the touch signal line 7 through a first through hole 10 formed in the first insulation layer 9. An orthographic projection of the first through hole 10 on the base substrate 5 is on a side, away from the transistor 6, of the opening region of the sub-pixel 3 where the first through hole is located.

In some embodiments, referring to FIG. 7A, FIG. 12, FIG. 14, and FIG. 15, the first insulation layer 9 includes an organic insulation layer 91 and an inorganic insulation layer 92 disposed along a direction away from the base substrate 5, wherein the organic insulation layer 91 is disposed between the drain electrode 63 of the transistor and the first sub-electrode 310, and the inorganic insulation layer 92 is disposed between the first sub-electrode 310 and the second sub-electrode 321. The drain electrode 63 of the transistor is coupled to the first sub-electrode 310 through a drain electrode through hole 90 in the organic insulation layer 91 to provide a data driving signal to the first sub-electrode 310. The first through hole 10 penetrates the organic insulation layer 91 and the inorganic insulation layer 92.

Figure 7B:
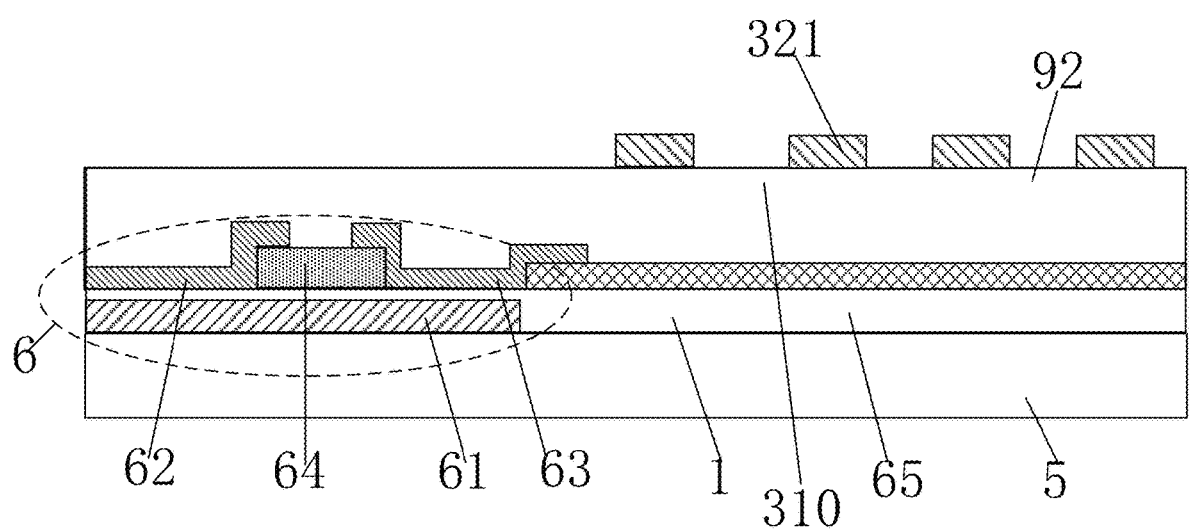
FIG. 7B is a cross-sectional view of another structure taken along the line CC' in FIG. 2A.

In some embodiments, referring to FIG. 7B, which is a cross-sectional view of another structure of the display substrate taken along line CC' in FIG. 2A, the first insulation layer includes only an inorganic insulation layer 92 disposed between the first sub-electrode 310 and the second block electrode 321. The drain electrode 63 of the transistor 6 is in direct contact with and coupled to the first sub-electrode 310. The touch signal line is coupled to the second block electrode 321 through a first through hole penetrating the inorganic insulation layer 92. The pixel structure of the display substrate in FIG. 7B is only suitable for the pixel structure scheme shown in FIG. 2A in which both of the touch signal line 7 and the data line 2 are located in parallel between two adjacent rows of sub-pixels each arranged along the second direction Y, but is not suitable for the pixel structure scheme in FIG. 3 in which the touch signal line 7 is located on a domain boundary between domain regions of a sub-pixel. In a case where the touch signal line is located on the domain boundary between domain regions of the sub-pixel, the touch signal line and the drain electrode 63 of the transistor are in the same layer, and the drain electrode 63 is in direct contact with the first sub-electrode 310; therefore, the touch signal line will be in direct contact with and short circuited to the first sub-electrode.

In some embodiments, the opening size of the drain electrode through hole 90 ranges from 7 μm to 10 μm. The opening size of the first through hole 10 ranges from 4 μm to 5 μm. The cross-sectional shape of the drain electrode through hole 90 along a direction perpendicular to the base substrate 5 is an inverted trapezoid. The opening size of the drain electrode through hole 90 is a diameter size of the upper opening of the drain electrode through hole 90 having a larger opening area/size. The first through hole 10 has an inverted trapezoidal shape in a cross section perpendicular to the base substrate 5, and an opening size of the first through hole 10 is a diameter size of an upper opening of the first through hole 10 having a large opening area/size.

In some embodiments, referring to FIG. 7A, FIG. 7B, FIG. 12 and FIG. 14, an active layer 64 of the transistor 6 is located on a side, proximal to the base substrate 5, of the touch signal line 7, the data line 2, and the source electrode 62 and the drain electrode 63 of the transistor 6 which are located in the same layer. The source electrode 62 and the drain electrode 63 are in contact with opposite ends of the active layer 64, respectively. The gate electrode 61 of the transistor 6 is located on a side of the active layer 64 proximal to the base substrate 5, and a gate insulation layer 65 is further disposed between the active layer 64 and the gate electrode 61.

Figure 7C:
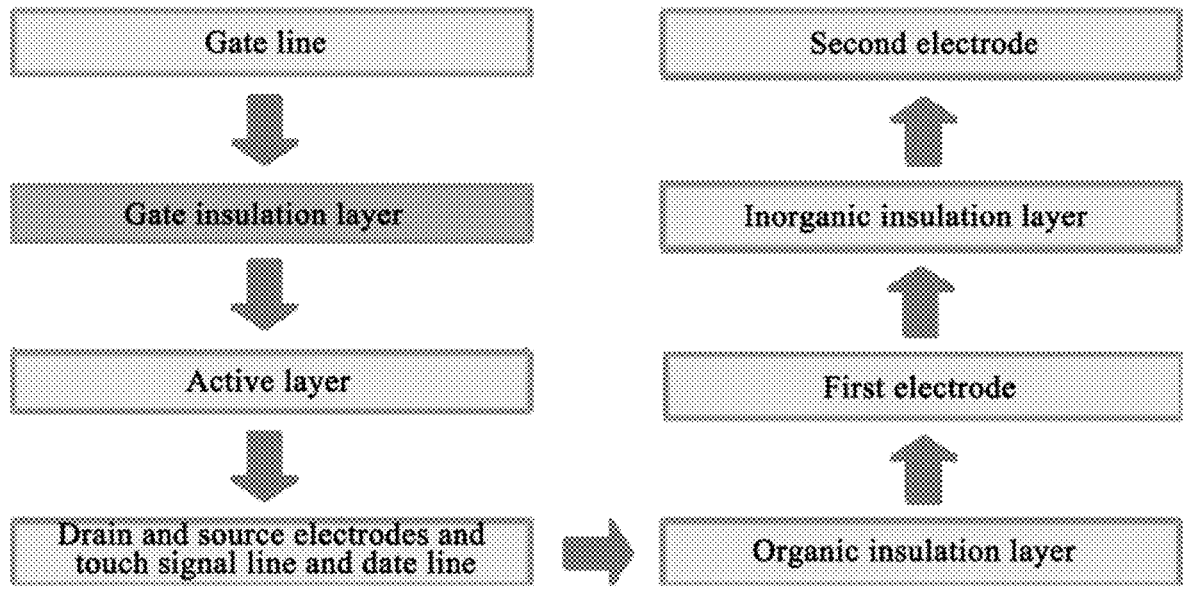
FIG. 7C is a flow chart of a method for manufacturing a display substrate having the pixel structure in FIG. 7A.

In some embodiments, referring to FIG. 7C, which is a flow chart of method for manufacturing the display substrate of the pixel structure of FIG. 7A is shown, the method includes: forming the gate electrode, the gate insulation layer, the active layer, the source electrode and the drain electrode and the touch signal line and the data line, the organic insulation layer, the first electrode, the inorganic insulation layer and the second electrode sequentially on a base substrate by using traditional patterning processes. The gate insulation layer is formed on the whole surface of the base substrate, so that a mask plate is not required for forming the gate insulation layer. Each of the other layers on the base substrate except the gate insulation layer is required to be formed by using one mask plate, that is, the display substrate having the pixel structure in FIG. 7A is formed by using seven mask plates (i.e., 7mask process). It should be noted that, in a case the gate insulation layer is formed into a local pattern not entirely covering the base substrate, the manufacture of the gate insulation layer also requires one process by using a mask plate, that is, the display substrate having the pixel structure in FIG. 7A is formed by using eight mask plates (i.e., 8mask process).

Figure 7D:
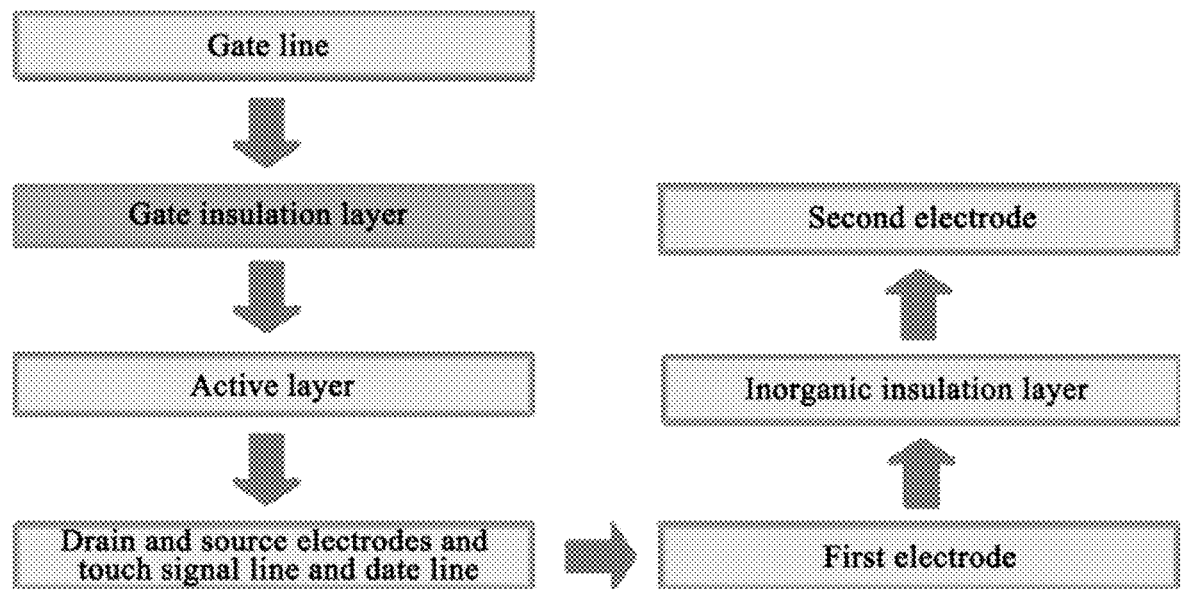
FIG. 7D is a flow chart of a method for manufacturing a display substrate having the pixel structure in FIG. 7B.

In some embodiments, referring to FIG. 7D, which is a flow chart of a method for manufacturing the display substrate having the pixel structure in FIG. 7B is shown, the method includes: forming the gate electrode, the gate insulation layer, the active layer, the source electrode and the drain electrode and the touch signal line and the data line, the first electrode, the inorganic insulation layer and the second electrode sequentially on the base substrate through traditional patterning processes. The gate insulation layer is formed on the whole surface of the base substrate, so that a mask plate is not required for manufacturing the gate insulation layer. Each of the other film layers on the base substrate except the gate insulation layer is required to be formed by using one mask plate, that is, the display substrate having the pixel structure in FIG. 7B is formed by using six mask plates (i.e., through a 6mask process).

In some embodiments, the active layer 64 may employ an amorphous silicon material, a low temperature polysilicon material, or an oxide semiconductor material.

Figure 16:
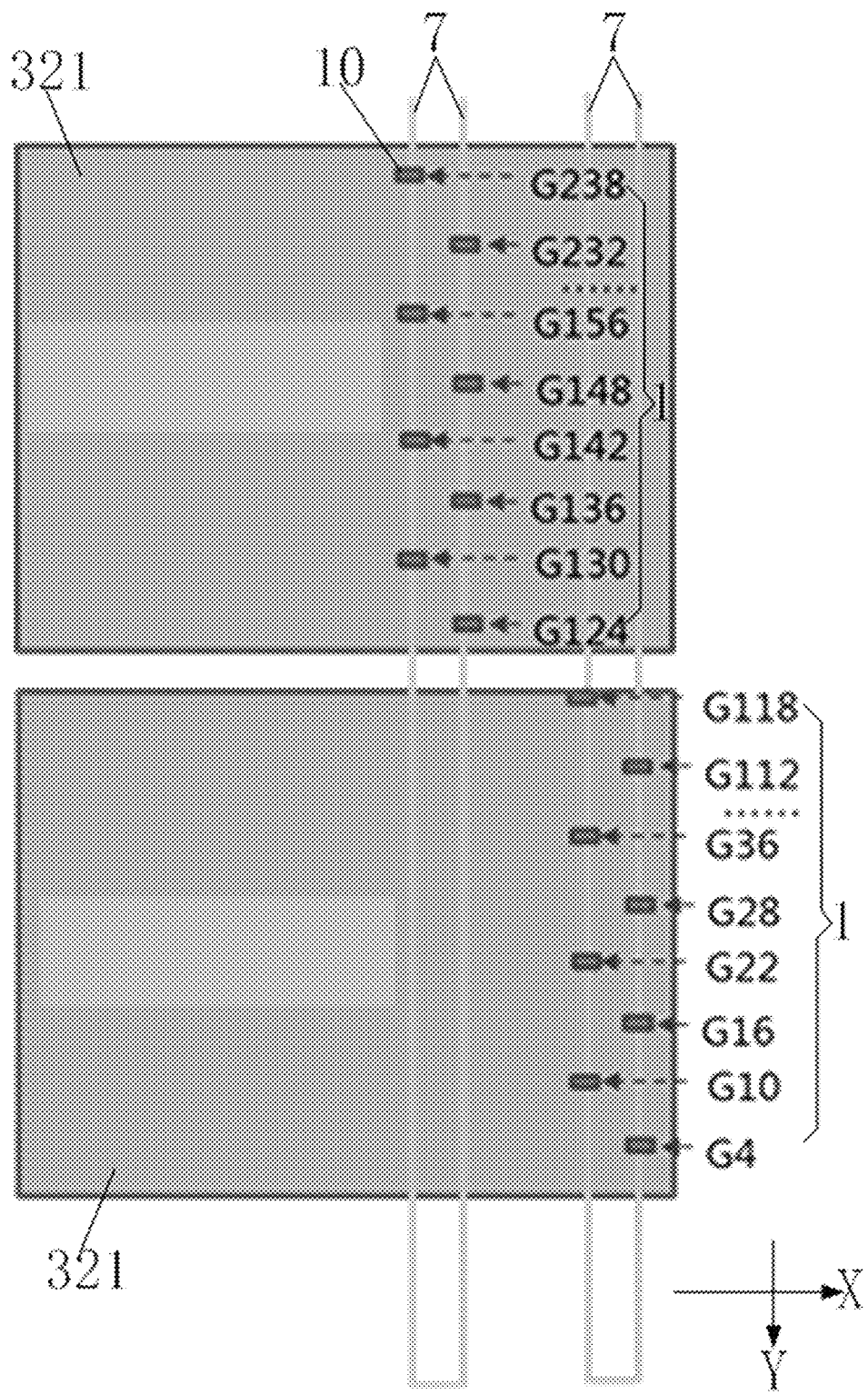
FIG. 16 is a schematic diagram showing an arrangement of the first through holes in an embodiment of the present disclosure.

FIG. 16 is a schematic diagram showing an arrangement of the first through holes in an embodiment of the present disclosure. In some embodiments, referring to FIG. 13, FIG. 14 and FIG. 16, each of the touch signal lines 7 is coupled to a corresponding second block electrode 321 through multiple first through holes 10, and the multiple first through holes 10 are arranged along the second direction Y. Multiple gate lines 1 are disposed between any two adjacent first through holes 10. In a row of pixel regions arranged along the first direction X and having the first through hole 10 formed therein, the first through hole 10 and the drain electrode 63 of the transistor 6 are respectively located on different straight lines extending along the first direction X. The minimum distance (a) between the first through hole 10 and a gate line 1 is less than the minimum distance b between a position where the drain electrode 63 of the transistor 6 is couple to the first sub-electrode 310 and the gate line 1.

In some embodiments, each of the touch signal lines 7 is coupled to one corresponding second block electrode 321 through five to fifteen first through holes 10. With the arrangement of the first through holes 10, the resistance of the second block electrode 321 can be decreased, the attenuation of the common voltage signal or the touch signal when the common voltage signal or the touch signal is transmitted on the second block electrode 321 can be reduced or avoided, and simultaneously loss of the common voltage signal or the touch signal when the common voltage signal or the touch signal is transmitted to the second block electrode 321 at the far end can be reduced or avoided, and the touch and display performances of the display substrate can be improved. It should be noted that the number and distribution position of the first through holes 10 may be adjusted according to specific products (such as products with different resolutions), and are not limited herein.

In an embodiment, referring to FIG. 10 and FIG. 16, the resolution of the display substrate is 1920×720, and each of the pixels in the display substrate includes one red sub-pixel, one green sub-pixel, and one blue sub-pixel. The second electrode 32 is divided into 48 (arranged along the first direction X)×18 (arranged along the second direction Y) second block electrodes 321 arranged in an array. Each of the second block electrodes 321 corresponds to 40 (arranged along the first direction X)×40 (arranged along the second direction Y) pixels arranged in an array. One touch signal line 7 is disposed between any two adjacent columns of pixels with pixels in each column arranged along the second direction Y. Each of the second block electrodes 321 is coupled to two touch signal lines 7. Each of the second block electrodes 321 corresponds to 40 rows of pixels with pixels in each row arranged along the first direction X. Each pixel is coupled to three gate lines 1, and one second electrode block 321 corresponds to one hundred and twenty gate lines 1. One first through hole 10 is formed for every six gate lines 1 and one second electrode block 321 corresponds to 20 first through holes 10, that is, the two touch signal lines 7 coupled to the second electrode block 321 each are coupled to the second electrode block 321 via ten first through holes 10.

Figure 17:
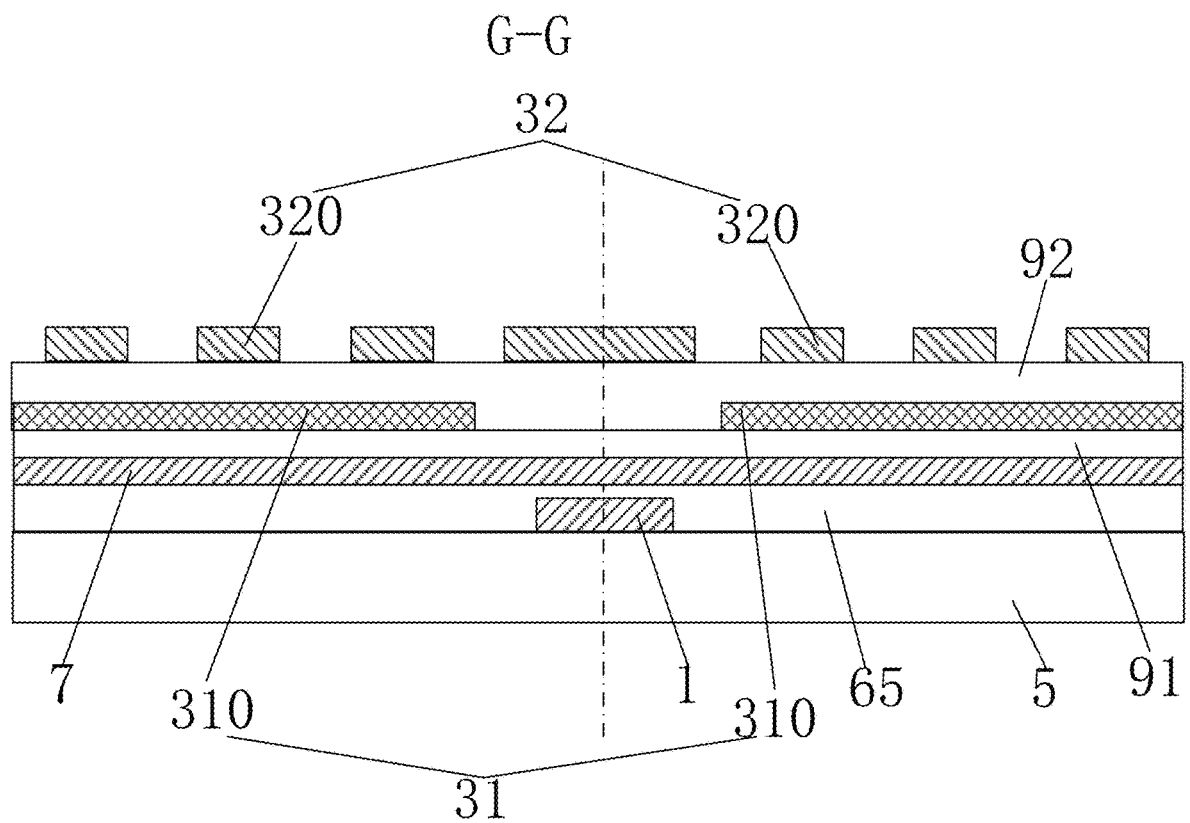
FIG. 17 is a cross-sectional view of a structure taken along a line GG of FIG. 3.

FIG. 17 is a cross-sectional view of a structure taken along a line GG of FIG. 3. The plurality of sub-pixels 3 are arranged in an array. In some embodiments, referring to FIG. 3 and FIG. 17, one data line 2 is disposed between any two adjacent columns of sub-pixels 3. The sub-pixels 3 is divided into two domain regions along the first direction X. The domain boundaries of a column of sub-pixels 3 are located on the same straight line. An orthographic projection of each of the touch signal lines 7 on the base substrate 5 overlaps orthographic projections of the domain boundaries of a corresponding column of sub-pixels 3 on the base substrate 5. In the embodiment, the plurality of touch signal lines 7 are in one-to-one correspondence to the domain boundaries of the plurality of columns of sub-pixels 3.

Figure 18:
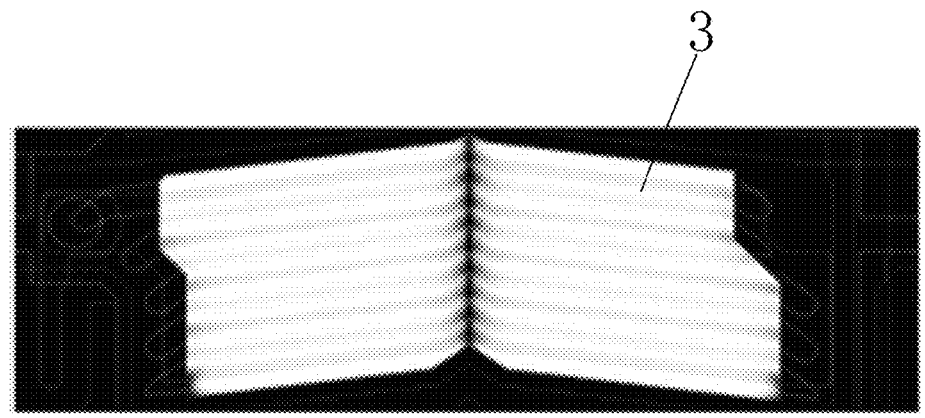
FIG. 18 is a light effect simulation diagram of the pixel structure of the display substrate in FIG. 2A.
Figure 19:
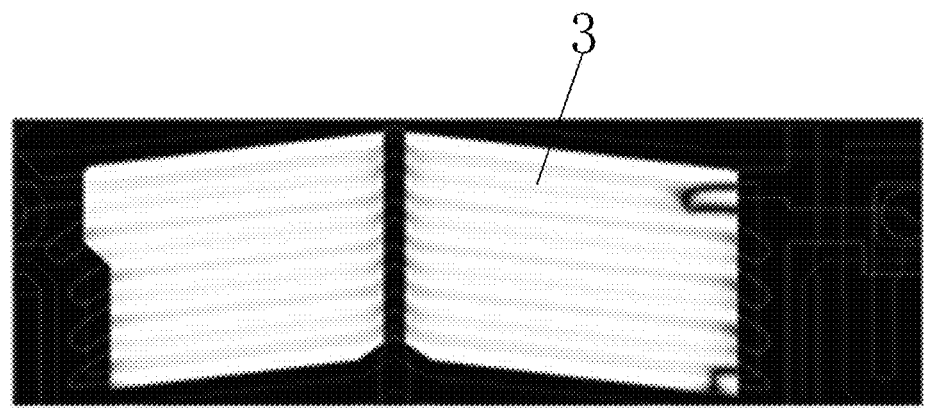
FIG. 19 is a light effect simulation diagram of the pixel structure of the display substrate in FIG. 3.

FIG. 18 is a light effect simulation diagram of the pixel structure of the display substrate in FIG. 2A; and FIG. 19 is a light effect simulation diagram of the pixel structure of the display substrate in FIG. 3. Referring to FIG. 18 and FIG. 19, the electric field formed between the first electrode and the second electrode at the domain boundary of the sub-pixel 3 is different from the electric field formed between the first electrode and the second electrode at other regions of the sub-pixel 3, so that the liquid crystal deflection angle at the boundary is different from that in the other regions, and in turn the display brightness at the domain boundary of the sub-pixel 3 is lower than that in the other regions. For example, the other regions of the sub-pixel 3 has a brightness of 255 gray scales, and the domain boundary has the brightness lower than 255 gray scales, therefore the domain boundary of the sub-pixel 3 is darker during display and is a dark display region of the sub-pixel 3. By forming the touch signal line 7 at the domain boundary of the sub-pixel 3, an aperture ratio of the sub-pixel can be effectively improved compared with the pixel structure in FIG. 2A. For example, through calculation, the sub-pixel in the pixel structure in FIG. 2A has an aperture ratio of 50%, and the sub-pixel in the pixel structure in FIG. 3 has an aperture ratio of 53%. The reason for the increased aperture ratio of the sub-pixel in the pixel structure in FIG. 3 lies in that in FIG. 2A the touch signal line 7 is beside the data line 2 and parallel with the data line 2, a certain distance is required between the touch signal line 7 and the data line 2 since both of the touch signal line 7 and the data line 2 are formed in the same layer and made of metal, otherwise it is easy to cause a short circuit between the touch signal line 7 and the data line 2. In general the distance between the touch signal line 7 and the data line 2 is designed to be about 5 μm, which leads to a waste to the aperture ratio of the sub-pixel.

In some embodiments, the number of the touch signal lines may alternatively be less than the number of the data lines. In this case, the touch signal lines are respectively disposed on the domain boundaries of a part of the columns of sub-pixels. For example, one touch signal line is located on the domain boundaries of one column of sub-pixels among every n columns of sub-pixels or at intervals of n columns of sub-pixels.

In some embodiments, for a display substrate with a resolution greater than 280, a sub-pixel design without the division of the domain regions may be used. For a display substrate with a resolution less than 280, a sub-pixel design with the division of the domain regions may be used, for example each of the sub-pixels is divided into two domain regions, i.e., 1P2D. The division of the domain regions can prevent the display substrate from poor image quality such as horizontal stripes.

Figure 20:
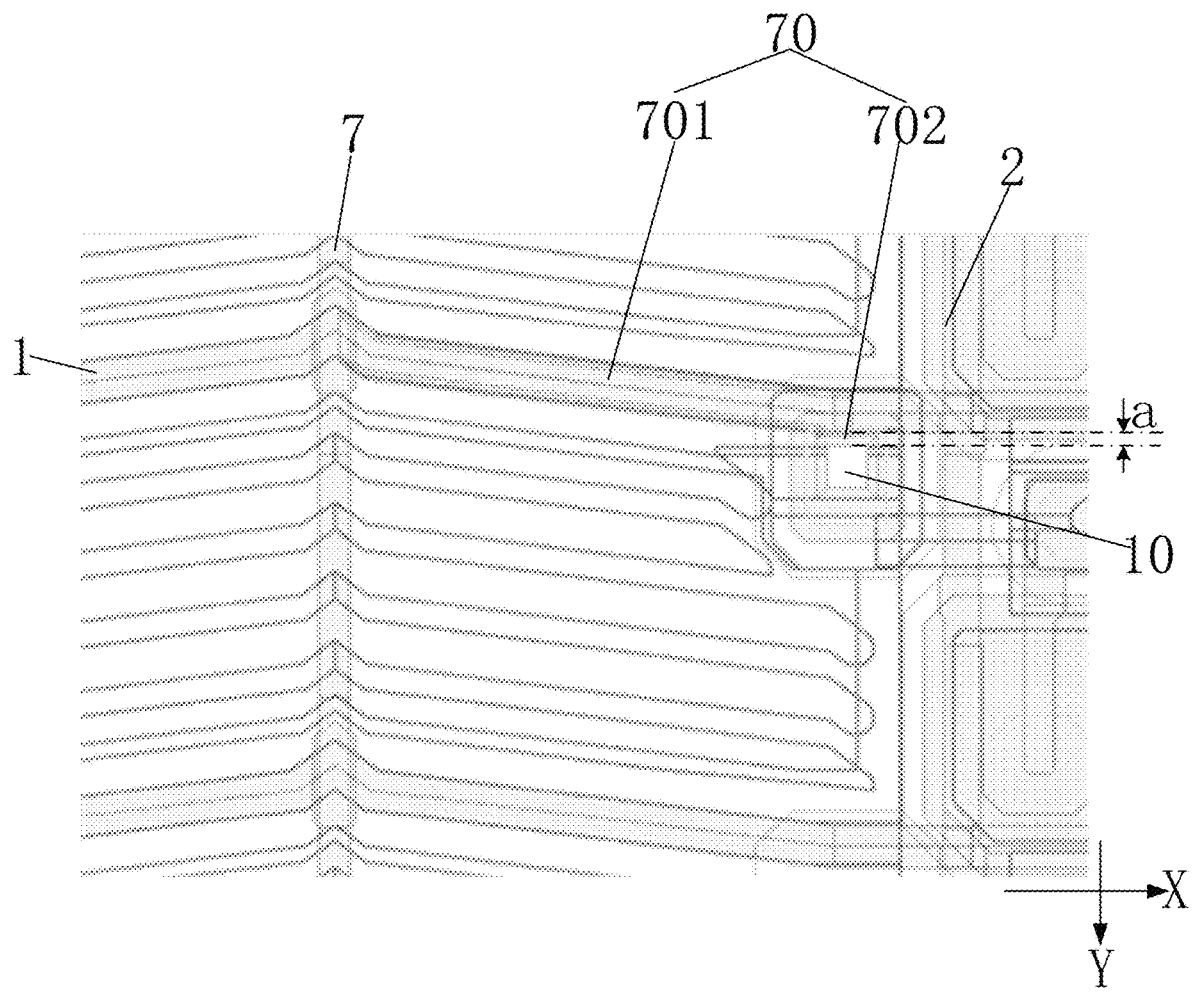
FIG. 20 is a top view of a structure in which a touch signal line located on a domain boundary is coupled to a first through hole in an embodiment of the present disclosure.

FIG. 20 is a top view of a structure in which a touch signal line located on a domain boundary is coupled to a first through hole in an embodiment of the present disclosure. In some embodiments, referring to FIG. 3, FIG. 17, and FIG. 20, domain boundaries of a column of sub-pixels 3 extend along the second direction Y. The touch signal line 7 on the boundary is coupled to the first through hole 10 via a first connection line 70. The first connection line 70 is located on the same layer as the touch signal line, and the gate line 1 is located on the same layer as the gate electrode 61 of the transistor. The first connection line 70 is located on a side of the gate line 1 away from the base substrate 5, and a second insulation layer is disposed between the first connection line 70 and the gate line 1. In some embodiments, the first connection line 70 includes a first connection sub-line 701 and a second connection sub-line 702. The first connection sub-lines 701 couples the touch signal lines 7 to the second connection sub-lines 702, and the second connection sub-line 702 is coupled to the first through hole 10. The first connection sub-line 701 extends along the first direction X, and an orthographic projection of the first connection sub-line 701 on the base substrate 1 overlaps an orthographic projection of the gate line 1 on the base substrate 1. An orthographic projection of the second connection sub-line 702 on the base substrate 5 is located within the pixel region 100, and the orthographic projection of the second connection sub-line 702 on the base substrate 5 overlaps the orthographic projection of the first through hole 10 on the base substrate 5.

In some embodiments, the second insulation layer is a gate insulation layer 65.

In some embodiments, referring to FIG. 20, a distance between the gate line 1, which has an orthographic projection overlapping the orthographic projection of the first connection sub-line 701, and the first through hole 10 is a minimum distance (a) between the gate line 1 and the first through hole 10.

In some embodiments, referring to FIG. 15, in a pixel region where no first through hole is formed, the plurality of gaps 300 in the second sub-electrode 320 include a first gap set 301 and a second gap set 302 arranged along the second direction Y. The first gap set 301 includes at least one gap 300, and the second gap set 302 includes at least one gap 300. The second gap set 302 and the transistor 6 are arranged along the first direction X. Each of the at least one gap 300 in the first gap set 301 is divided into two sub-gaps by the touch signal line 7 on the boundary, and each of the at least one gap 300 in the second gap set 302 is divided into two sub-gaps by the touch signal line 7 on the boundary. A length (c) of the sub-gap of the first gap set 301 on a side of the touch signal line 7 proximal to the transistor 6 is greater than a length (d) of the sub-gap of the first gap set 301 on a side of the touch signal line 7 away from the transistor 6. A length (e) of the sub-gap of the second gap set 302 on a side of the touch signal line 7 proximal to the transistor 6 is less than a length (f) of the sub-gap of the second gap set 302 on a side of the touch signal line 7 away from the transistor 6. Since the second sub-electrode 320 does not extend to the region where the transistor 6 is located, the length (e) of the sub-gap of the second gap set 302 on a side of the touch signal line 7 proximal to the transistor 6 is less than the length (f) of the sub-gap of the second gap set on a side of the touch signal line 7 away from the transistor 6.

In some embodiments, referring to FIG. 15, the first gap set 301 includes one gap 300, and the second gap set 302 includes three gaps 300 arranged along the second direction Y in sequence.

In some embodiments, referring to FIG. 15, the length (d) of the sub-gap of the first gap set 301 on a side of the touch signal line 7 away from the transistor 6 is less than the length (f) of each of the sub-gaps of the second gap set 302 on a side of the touch signal line 7 away from the transistor 6.

In some embodiments, for example, the length (d) of the sub-gap of the first gap set 301 on a side of the touch signal line 7 away from the transistor 6 is 43 μm, and the length (f) of each of the sub-gaps of the second gap set 302 on a side of the touch signal line 7 away from the transistor 6 is 53 μm.

In some embodiments, referring to FIG. 15, in the pixel region where the first through hole 10 is formed, the plurality of gaps 300 on the second sub-electrode 320 include a third gap set 303 and a fourth gap set 304 arranged along the second direction Y. The third gap set 303 includes at least one gap 300, and the fourth gap set 304 includes at least one gap 300. The third gap set 303 and the first through holes 10 are arranged along the first direction X, and the fourth gap set 304 and the transistor 6 are arranged along the first direction X. Each of the at least one gap 300 in the third gap set 303 is divided into two sub-gaps by the touch signal line 7 on the domain boundary, and each of the at least one gap 300 in the fourth gap set 304 is divided into two sub-gaps by the touch signal line 7 on the domain boundary. A length (g) of the sub-gap of the third gap set 303 on a side of the touch signal line 7 away from the first through hole 10 is greater than a length (h) of the sub-gap of the third gap set 303 on a side of the touch signal line 7 proximal to the first through hole 10. A length (i) of the sub-gap of the fourth gap set 304 on a side of the touch signal line 7 proximal to the transistor 6 is less than a length (j) of the sub-gap of the fourth gap set 304 on a side of the touch signal line 7 away from the transistor 6. Since a portion of the second sub-electrode 320 extending to the region, where the first through hole 10 is located, covers the first through hole 10, no gap is formed in the portion of the second sub-electrode 320 covering the first through hole 10. Therefore, the length (g) of the sub-gap of the third gap set 303 on a side of the touch signal line 7 away from the first through hole 10 is greater than the length (h) of the sub-gap of the third gap set 303 on a side of the touch signal line 7 proximal to the first through hole 10.

In some embodiments, referring to FIG. 15, the third gap set 303 includes one gap 300, and the fourth gap set 304 includes three gaps 300 arranged along the second direction Y in sequence.

In some embodiments, referring to FIG. 15, a length (h) of the sub-gap of the third gap set 303 on a side of the touch signal line 7 proximal to the first through hole 10 is less than a length (j) of each of the sub-gaps of the fourth gap set 304 on a side of the touch signal line 7 away from the transistor 6.

In some embodiments, for example the length (h) of the sub-gap of the third gap set 303 on a side of the touch signal line 7 proximal to the first through hole 10 is 43 μm, and the length (j) of the each of the sub-gaps of the fourth gap set 304 on a side of the touch signal line 7 away from the transistor 6 is 53 μm.

In some embodiments, in any one of the gap sets, an included angle between the extension direction of the sub-gaps on a side of the touch signal line 7 proximal to the transistor 6 and the second direction Y is −83°, and an included angle between the extension direction of the sub-gaps on a side of the touch signal line 7 away from the transistor 6 and the second direction Y is 83°. The included angle between the extending direction of the sub-gaps and the second direction Y may be adjusted. For example, the included angle between the extending direction of the sub-gaps on a side of the touch signal line 7 proximal to the transistor 6 and the second direction Y may be any one of −5°, −7°, −10°, −15°, and −20°. The included angle between the extending direction of the sub-gaps on a side of the touch signal line 7 away from the transistor 6 and the second direction Y may be any one of 5°, 7°, 10°, 15°, and 20°. The larger the included angle between the extending direction of the sub-gaps and the second direction Y is, the faster the response time of the display substrate is, and thus the display substrate is mainly applied to products with higher requirements on response speed, such as game machines (gaming) and the like. The smaller the included angle between the extending direction of the sub-gaps and the second direction Y, the smaller the driving voltage of the electrode for driving the liquid crystal is, and the better the transmittance of the display substrate is, and thus the display substrate is mainly applied to the products with higher requirement on transmittance.

An embodiment of the present disclosure further provides a display device, which includes the display substrate in any one of above embodiments.

In some embodiments, the display device further includes a counter substrate which is aligned with the display substrate to form a cell gap therebetween. The cell gap is filled with liquid crystal, that is, the display device is a liquid crystal display panel.

In some embodiments, the display substrate further includes a color filter layer on a side of the display substrate proximal to the counter substrate. The display substrate is in color on array (COA) mode.

In some embodiments, the counter substrate includes a substrate and a color filter layer on a side of the substrate proximal to the display substrate.

In some embodiments, the color filter layer includes color filters in various colors, such as a red color filter, a green color filter, and a blue color filter, where each of the color filters is in one-to-one correspondence to a corresponding one of the sub-pixels in the display substrate. The colors of the color filters are not limited to red, green and blue, and the color filters may have other colors (such as white), as long as the combination of the color filters in various colors in one pixel can realize the color display of the pixel.

In some embodiments, each of the pixels includes three sub-pixels. Each of the red color filter, the green color filter and the blue color filter corresponds to one sub-pixel. The red color filter, the green color filter and the blue color filter are arranged along the second direction along which the three sub-pixels are arranged. The arrangement, along the second direction, of the red color filter, the green color filter and the blue color filter in one pixel is not limited, for example the red color filter, the green color filter and the blue color filter may be arranged along the second direction in sequence, or the green color filter, the red color filter and the blue color filter may be arranged along the second direction in sequence.

In some embodiments, the color filter layer further includes a black matrix corresponding to a region outside the opening regions of the sub-pixels in the display substrate. The black matrix is configured to shield the region (i.e., the non-display region) outside the opening regions of the sub-pixels in the display substrate, so as to implement color display of the display device.

In some embodiments, the display panel may alternatively be a Mini LED, Micro LED, or OLED display panel, which will not repeated herein.

With the display substrate in any one of the above-mentioned embodiments, the number of data lines can be greatly decreased with the resolution of the display panel remains unchanged. The data lines are coupled to the data driver chip, so that the data driver chip provides data driver signals for the data lines, thereby greatly reducing the number of data driver chips used, and thus the cost of using the data driver chips.

The display panel may be: any product or component with a display function, such as an LCD panel, an LCD television, a Mini LED panel, a Micro LED panel, an OLED panel, a mobile phone, a tablet computer, a notebook computer, a monitor, a notebook computer, a digital photo frame, or a navigator.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and essence of the present disclosure, and these changes and modifications are to be considered within the scope of the present disclosure.

What is claimed is:

1. A display substrate comprises a base substrate, a plurality of gate lines and a plurality of data lines, wherein
the plurality of gate lines each extend along a first direction, and the plurality of data lines each extend along a second direction,
the plurality of data lines are spatially crossed with the plurality of gate lines to define a plurality of pixel regions, and at least one sub-pixel is provided in each of the plurality of pixel regions,
at least three sub-pixels adjacent to each other along the second direction form one of a plurality of pixels;
all the sub-pixels within one of the plurality of pixels are coupled to a same data line of the plurality of data lines,
each of the pixels comprises a first electrode and a second electrode on the base substrate, the first electrode and the second electrode are disposed away from the base substrate in sequence, the first electrode comprises a plurality of first sub-electrodes and the second electrode comprises a plurality of second sub-electrodes, an orthographic projections of the first sub-electrode on the base substrate at least partially overlaps an orthographic projections of the second sub-electrode on the base substrate, and the second sub-electrodes adjacent to each other along the first direction and/or the second direction are coupled to each other to form a second block electrode serving as a touch electrode,
each second sub-electrode is provided with a plurality of gaps arranged along the second direction, spaced apart from each other, and each extending along the first direction,
the sub-pixels are arranged in an array, one data line is disposed between any two adjacent columns of the sub-pixels, each of the sub-pixels is divided to two domain regions by a domain boundary extending along the first direction, and the domain boundaries of a column of sub-pixels are on a same straight line, and an orthographic projection of each of the touch signal lines on the base substrate overlaps orthographic projections of the domain boundaries of the column of sub-pixels on the base substrate,
each of the sub-pixels comprises one transistor, the second block electrode is on a side of the touch signal line away from the base substrate, a first insulation layer is between the second block electrode and the touch signal line, the second block electrode is coupled to the touch signal line via a first through hole formed in the first insulation layer, and an orthographic projection of the first through hole on the base substrate is on a side, away from the transistor, of the opening region of the sub-pixel where the first through hole is located,
in the pixel region where the first through hole is formed, the plurality of gaps in the second sub-electrode comprise a third gap set and a fourth gap set arranged along the second direction, the third gap set comprises at least one gap and the fourth gap set comprises at least one gap, the third gap set and the first through hole are arranged along the first direction, and the fourth gap set and the transistor are arranged along the first direction, the touch signal line on the domain boundaries divides each of the at least one gap of the third gap set into two sub-gaps and divides the each of at least one gap of the fourth gap set into two sub-gaps, a length of the sub-gap of the third gap set on a side of the touch signal line away from the first through hole is greater than a length of the sub-gap of the third gap set on a side of the touch signal line proximal to the first through hole, and a length of the sub-gap of the fourth gap set on a side of the touch signal line proximal to the transistor is less than a length of the sub-gap of the fourth gap set on a side of the touch signal line away from the transistor.

2. The display substrate of claim 1, wherein
one sub-pixel is disposed in each of the plurality of pixel regions,
all the sub-pixels of each of the pixels are arranged along the second direction in sequence, and
all the sub-pixels of each of the pixels are coupled to different gate lines of the plurality of gate lines, respectively.

3. The display substrate of claim 1, wherein the formed second block electrode comprises a plurality of second block electrodes arranged in an array;
each of the plurality of second sub-electrodes comprises the same number of second sub-electrodes arranged in an array,
and
in two adjacent rows of the second sub-electrodes in two second block electrodes adjacent to each other along the second direction, one row of the second sub-electrodes is disconnected from the other row of the second sub-electrodes.

4. The display substrate of claim 3, wherein
the transistor is located at a position where the data line crosses the gate line; and an orthographic projection of the transistor on the base substrate is between an orthographic projection, on the base substrate, of an opening region of the sub-pixel where the transistor is located and an orthographic projection, on the base substrate, of the data line coupled to the sub-pixel,
a gate electrode of the transistor is proximal to the gate line coupled to the transistor, a source electrode of the transistor is proximal to the data line coupled to the transistor, and a drain electrode of the transistor is proximal to a gate electrode of another transistor adjacent to the transistor along the second direction,
the drain electrode is coupled to the first sub-electrode,
two second sub-electrodes adjacent to each other along the first direction in the second block electrode are coupled to each other via a first connection portion, and
the first connection portion extends along the first direction, and an orthographic projection of the first connection portion on the base substrate and an orthographic projection of the data line on the base substrate intersect each other.

5. The display substrate of claim 4, wherein the first connection portion is in the same layer as the second sub-electrode.

6. The display substrate of claim 5, further comprising a second connection portion configured to couple two second sub-electrodes adjacent to each other along the second direction in the second block electrode.

7. The display substrate of claim 4, further comprising a plurality of touch signal line sets, each of the plurality of touch signal line sets comprising a plurality of touch signal lines,
- each of the plurality of touch signal lines extends along the second direction,
- each of the plurality touch signal line sets corresponds to one column of second block electrodes, and
- each of the second block electrodes is coupled to at least one of the plurality of touch signal lines.

8. The display substrate of claim 1, wherein the touch signal line is located at the same layer as the data line, and the source electrode and drain electrode of the transistor.

9. The display substrate of claim 8, wherein one of the touch signal lines is coupled to a corresponding one of the second block electrodes through a plurality of the first through holes arranged along the second direction;
- multiple gate lines are disposed between any two adjacent first through holes of the plurality of the first through holes,
- in a row of the pixel regions, in which the first through hole is formed, with the pixel regions arranged along the first direction, the first through hole and the drain electrode of the transistor are respectively located on different straight lines extending along the first direction, and a minimum distance between the first through hole and one of the gate lines closest to the first through hole is less than a minimum distance between a position where the drain electrode of the transistor is coupled to the first sub-electrode and the gate line.

10. The display substrate of claim 9, wherein the domain boundaries of the column of sub-pixels extend along the second direction,
- the touch signal line on the domain boundaries is coupled to the first through hole through a first connection line, and
- the first connection line is in the same layer as the touch signal line, the gate line is in the same layer as the gate electrode of the transistor, the first connection line is on a side of the gate line away from the base substrate, and a second insulation layer is between the first connection line and the gate line.

11. The display substrate of claim 10, wherein the first connection line comprises a first connection sub-line and a second connection sub-line, the first connection sub-line couples the touch signal line to the second connection sub-line, and the second connection sub-line is coupled to the first through hole,
- the first connection sub-line extends along the first direction, and an orthographic projections of the first connection sub-lines on the base substrate overlaps an orthographic projections of the gate lines on the base substrate, and
- an orthographic projection of the second connection sub-line on the base substrate is within the pixel region, and the orthographic projection of the second connection sub-line on the base substrate overlaps the orthographic projection of the first through hole on the base substrate.

12. The display substrate of claim 8, wherein in the pixel region where no first through hole is formed, the plurality of gaps in the second sub-electrode comprise a first gap set and a second gap set arranged along the second direction,
- the first gap set comprises at least one gap, and the second gap set comprises at least one gap;
- the second gap set and the transistor are arranged along the first direction,
- the touch signal line on the domain boundaries divides each of the at least one gap in the first gap set into two sub-gaps, and divides each of the at least one gap in the second gap set into two sub-gaps,
- a length of the sub-gap of the first gap set on a side of the touch signal line proximal to the transistor is greater than a length of the sub-gap of the first gap set on a side of the touch signal line away from the transistor, and
- a length of the sub-gap of the second gap set on the side of the touch signal line proximal to the transistor is less than a length of the sub-gap of the second gap set on the side of the touch signal line away from the transistor.

13. The display substrate of claim 12, wherein the length of the sub-gap of the first gap set on the side of the touch signal line away from the transistor is less than the length of the sub-gap of the second gap set on the side of the touch signal line away from the transistor.

14. The display substrate of claim 1, wherein the length of the sub-gap of the third gap set on the side of the touch signal line proximal to the first through hole is less than the length of the sub-gap of the fourth gap set on the side of the touch signal line away from the transistor.

15. A display device, comprising the display substrate of claim 1.

* * * * *